(12) United States Patent
Wu et al.

(10) Patent No.: US 11,672,126 B2
(45) Date of Patent: Jun. 6, 2023

(54) THREE-DIMENSIONAL MEMORY DEVICE AND MANUFACTURING METHOD THEREOF

(71) Applicant: Taiwan Semiconductor Manufacturing Co., Ltd., Hsin-Chu (TW)

(72) Inventors: Chao-I Wu, Zhubei (TW); Sai-Hooi Yeong, Zhubei (TW); Yu-Ming Lin, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 53 days.

(21) Appl. No.: 17/137,768

(22) Filed: Dec. 30, 2020

(65) Prior Publication Data

US 2021/0399014 A1 Dec. 23, 2021

Related U.S. Application Data

(60) Provisional application No. 63/040,791, filed on Jun. 18, 2020.

(51) Int. Cl.
*H10B 51/20* (2023.01)
*H01L 27/11597* (2017.01)
*H01L 27/11587* (2017.01)
*H10B 51/10* (2023.01)

(52) U.S. Cl.
CPC .. *H01L 27/11597* (2013.01); *H01L 27/11587* (2013.01)

(58) Field of Classification Search
CPC ......... H01L 27/11587; H01L 27/11592; H01L 27/11597
See application file for complete search history.

(56) References Cited

U.S. PATENT DOCUMENTS

| 10,056,400 | B2* | 8/2018 | Kikushima | ....... H01L 21/32133 |
| 2011/0294290 | A1 | 12/2011 | Nakanishi et al. | |
| 2014/0048868 | A1* | 2/2014 | Kim | .................. H01L 29/7926 |
| | | | | 257/324 |
| 2014/0187029 | A1* | 7/2014 | Seol | .................. H01L 21/76877 |
| | | | | 438/618 |
| 2016/0118404 | A1 | 4/2016 | Peng | |

(Continued)

*Primary Examiner* — Meiya Li
(74) *Attorney, Agent, or Firm* — Eschweiler & Potashnik, LLC

(57) ABSTRACT

A three-dimensional memory device including first and second stacking structures and first and second conductive pillars is provided. The first stacking structure includes first stacking layers stacked along a vertical direction. Each first stacking layer includes a first gate layer, a first channel layer, and a first ferroelectric layer between the first gate and channel layers. The second stacking structure is laterally spaced from the first stacking structure and includes second stacking layers stacked along the vertical direction. Each second stacking layer includes a second gate layer, a second channel layer, and a second ferroelectric layer is between the second gate and channel layers. The first and second gate layers are disposed between the first and second ferroelectric layers, and the first and second conductive pillars extend along the vertical direction in contact respectively with the first and second channel layers.

20 Claims, 24 Drawing Sheets

(56) References Cited

U.S. PATENT DOCUMENTS

| | | | |
|---|---|---|---|
| 2019/0296039 A1* | 9/2019 | Maeda | H01L 29/66833 |
| 2020/0026990 A1 | 1/2020 | Lue | |
| 2021/0210497 A1* | 7/2021 | Yang | H01L 27/249 |
| 2021/0217775 A1* | 7/2021 | Zhang | H01L 27/11587 |

* cited by examiner

THREE-DIMENSIONAL MEMORY DEVICE AND MANUFACTURING METHOD THEREOF

REFERENCE TO RELATED APPLICATION

This application claims the benefit of U.S. Provisional Application No. 63/040,791, filed on Jun. 18, 2020. The contents of the above-referenced application are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional (3D) memory device has been introduced to replace a planar memory device. However, the 3D memory device has not been satisfactory in all respects. Additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 11A are schematic top views of structures produced at various stages of a manufacturing method of a three-dimensional memory device in accordance with some embodiments of the disclosure.

FIG. 1B to FIG. 11B are schematic cross-sectional views along the lines A-A' shown in FIG. 1A to FIG. 11A, respectively.

FIG. 4C to FIG. 11C are schematic plan views along the lines B-B' shown in FIG. 4B to FIG. 11B, respectively.

DETAILED DESCRIPTION

Figure 1A:
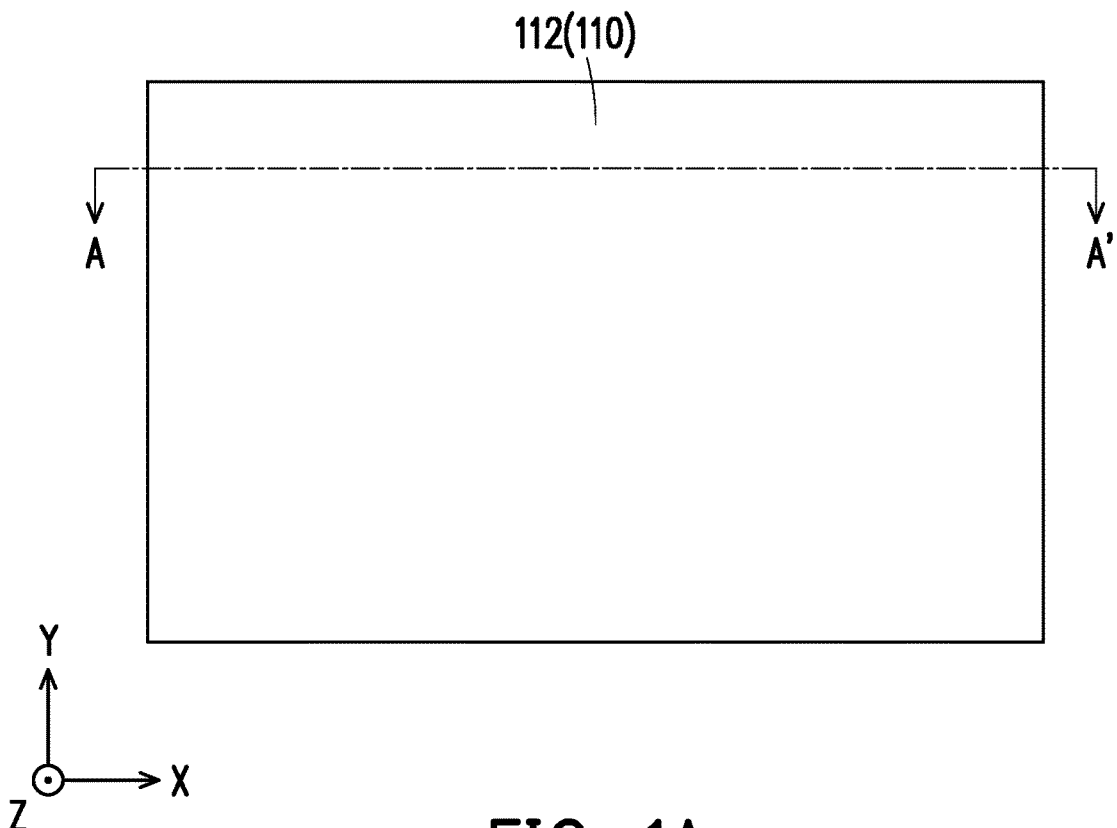

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Among various non-volatile memories, the ferroelectric field effect transistor (FeFET) is a promising candidate for high-density, low-power application. Due to its field-driven operation, the FeFET has advantages such as non-destructive readout, high program/erase speed, and low power consumption. In addition, the FeFET has attracted more attention because of its high scalability and high CMOS compatibility. Toward even higher density, a three-dimensional (3D) vertical structure is proposed. Generally, poly-silicon is used as a channel material. However, there are several challenges with the poly-silicon channel, such as low carrier mobility at the very thin poly-silicon channel and an interfacial layer with a low dielectric constant between the ferroelectric material and the poly-silicon. Because of the capacitance mismatch between the interfacial layer with a low dielectric constant and the ferroelectric material, a large voltage is applied on the interfacial layer during operation. This eventually results in the breakdown of the interfacial layer, thereby causing an endurance failure. In addition, the interfacial layer with low dielectric constant increases charge trapping, which results in a threshold voltage shift issue that degrades reliability.

To overcome the foregoing challenges, a FeFET with an oxide semiconductor channel is proposed. The oxide semiconductor channel is suitable for fast access speeds due to its high carrier mobility with a very thin body.

FIG. 1A to FIG. 11A are schematic top views of structures produced at various stages of a manufacturing method of a three-dimensional memory device 10 in accordance with some embodiments of the disclosure. FIG. 1B to FIG. 11B are schematic cross-sectional views along the lines A-A' shown in FIG. 1A to FIG. 11A, respectively. FIG. 4C to FIG. 11C are schematic plan views along the lines B-B' shown in FIG. 4B to FIG. 11B, respectively.

Figure 1B:
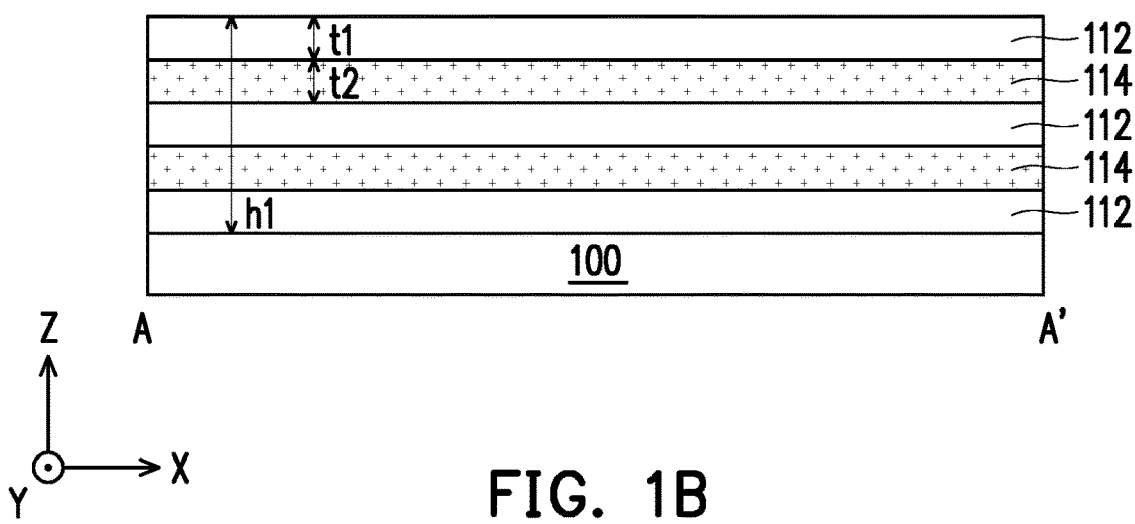

Referring to FIG. 1A and FIG. 1B, a multilayer stack 110 is formed on the substrate 100. The multilayer stack 110 includes insulating layers 112 and sacrificial layers 114. As shown in FIG. 1B, the insulating layers 112 and the sacrificial layers 114 are alternately stacked on the substrate 100 along a direction Z. In detail, the insulating layers 112 are space apart from one another by the sacrificial layers 114 along the direction Z. That is to say, the insulating layers 112 are vertically space apart from one another by the sacrificial layers 114. From another point of view, each sacrificial layer 114 is sandwiched between an underlying insulating layer 112 and an overlying insulating layer 112. Further, the sacrificial layers 114 will be replaced by gate layers 118 in the subsequent steps to be described with reference to FIGS. 9A-9C and FIGS. 10A-10C. Although three insulating layers 112 and two sacrificial layers 114 are presented in FIG. 1B for illustrative purposes, those skilled in the art can understand that the number of the insulating layers 112 and the number of the sacrificial layers 114 may be more than what are depicted in FIG. 1B, and may be designated based on demand and/or design layout.

In some embodiments, the material of the insulating layers 112 has a sufficient etching selectivity with respect to the material of the sacrificial layers 114, such that the insulating layers 112 could remain substantially intact during removal of the sacrificial layers 114 in the subsequent step as to be described with reference to FIGS. 9A-9C. In some embodiments, the insulating layers 112 are made of silicon oxide, while the sacrificial layers 114 are made of silicon nitride. However, those skilled in the art may select other suitable materials for the insulating layers 112 and the sacrificial layers 114 according to process requirements. In some alternative embodiments, the material of the insulating layers 112 may be selected from silicon nitride, silicon oxynitride, phosphosilicate glass (PSG), borosilicate glass (BSG), or boron-doped phosphosilicate glass (BPSG), and the material of the sacrificial layers 114 may be selected from silicon oxide, silicon oxynitride, PSG, BSG, or BPSG. In some embodiments, the insulating layers 112 have the same dielectric material, such as silicon oxide. However, the embodiments of the present disclosure are not limited thereto. In some alternative embodiments, the insulating layers 112 may have different dielectric materials. Similarly, in some embodiments, the sacrificial layers 114 have the same dielectric material, such as silicon nitride. However, the embodiments of the present disclosure are not limited thereto. In some alternative embodiments, the sacrificial layers 114 may have different dielectric materials. In some embodiments, the method for forming each of the insulating layers 112 and each of the sacrificial layers 114 includes a deposition process, such as a chemical vapor deposition (CVD) process or an atomic layer deposition (ALD) process.

In some embodiments, the substrate 100 is an etching stop layer formed over a complementary metal-oxide-semiconductor (CMOS) integrated circuit. In these embodiments, the material of the substrate 100 has a sufficient etching selectivity with respect to the materials in the multilayer stack 110. In these embodiments, the material of the substrate 100 includes silicon carbide, silicon oxynitride, silicon oxycarbide, silicon carbonitride, silicon oxide, or silicon nitride. In those embodiments where the insulating layers 112 and the sacrificial layers 114 are made of silicon oxide and silicon nitride, the material of the substrate 100 is formed of silicon carbide. However, the disclosure is not limited thereto. In some alternative embodiments, the substrate 100 is a semiconductor wafer or a semiconductor-on-insulator (SOI) wafer.

In some embodiments, along the direction Z, the insulating layers 112 have a thickness t1 in the range of about 15 nm to about 90 nm, and the sacrificial layers 114 have a thickness t2 in the range of about 15 nm to about 90 nm. In some embodiments, the insulating layers 112 are formed to a different thickness than the sacrificial layers 114. In some alternative embodiments, the insulating layers 112 are formed to the same thickness as the sacrificial layers 114. For example, the thickness t2 of the sacrificial layers 114 is from about 10% to about 50% greater than or less than the thickness t1 of the insulating layers 112. In some embodiments, the multilayer stack 110 has an overall height h1 in the range of about 1000 nm to about 10000 nm along the direction Z.

Figure 2A:
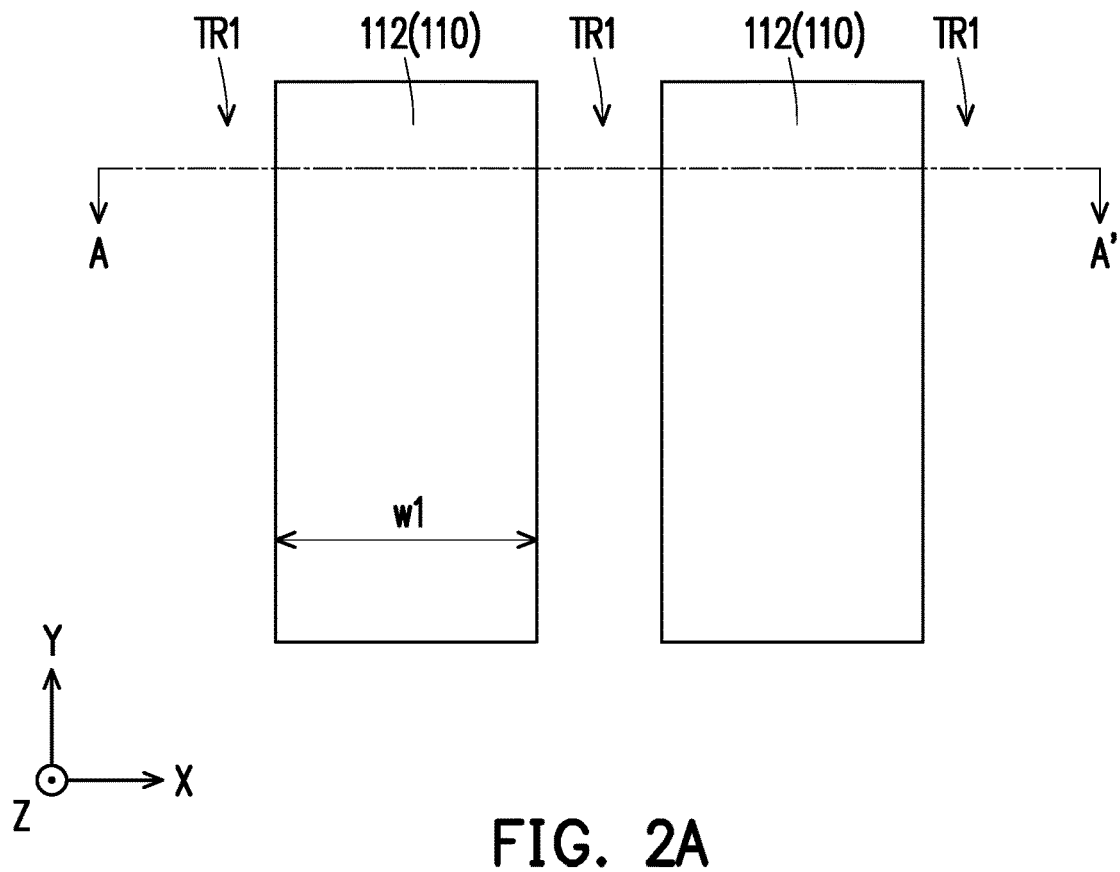
Figure 2B:
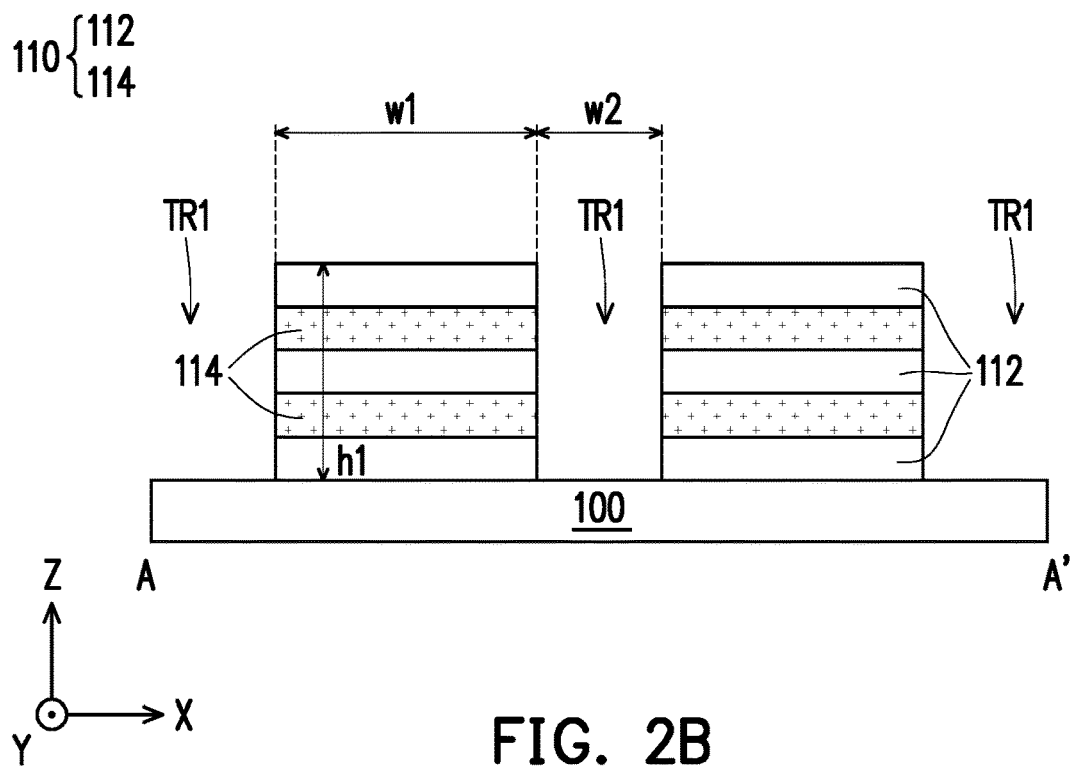

Referring to FIG. 2A and FIG. 2B, trenches TR1 are formed in the multilayer stack 110. As shown in FIG. 2B, the trenches TR1 penetrate through the multilayer stack 110 along the direction Z. That is to say, the trenches TR1 vertically extend in the multilayer stack 110. In the illustrated embodiment, the trenches TR1 vertically extend through all layers (e.g., all of the insulating layers 112 and all of the sacrificial layers 114) of the multilayer stack 110 and expose the substrate 100. That is to say, the bottom surfaces of the trenches TR1 are defined by the substrate 100. In other words, the substrate 100 is exposed at the bottoms of the trenches TR1. However, the disclosure is not limited thereto. In some alternative embodiments, the trenches TR1 vertically extend through some but not all layers of the multilayer stack 110. For example, the trenches TR1 may vertically extend through all of the sacrificial layers 114 and expose the bottommost insulating layer 112. Although three trenches TR1 are presented in FIG. 2A and FIG. 2B for illustrative purposes, those skilled in the art can understand that the number of the trenches TR1 may be more than what is depicted in FIG. 2A and FIG. 2B, and may be designated based on demand and/or design layout.

As shown in the top view of FIG. 2A, the trenches TR1 vertically penetrating through the multilayer stack 110 laterally extend along a direction Y perpendicular to the direction Z and are arranged along a direction X perpendicular to the direction Y and the direction Z. Accordingly, the multilayer stack 110 is cut into multiple strip portions by the trenches TR. In such case, the multiple strip portions are referred to as the remaining portions of the multilayer stack 110 hereinafter. Further, after forming the trenches TR1, each remaining portion of the multilayer stack 110 is disposed between two adjacent trenches TR1 along the direction X. That is to say, two adjacent remaining portions of the multilayer stack 110 are spaced apart from each other by the corresponding trench TR1. In some embodiments, the remaining portions of the multilayer stack 110 have a width w1 in the range of about 50 nm to about 200 nm along the direction X and further have the height h1 discussed with respect to FIG. 1A and FIG. 1B. In some embodiments, the trenches TR1 have a width w2 in the range of about 50 nm to about 200 nm along the direction X. The aspect ratio (AR) of each remaining portion of the multilayer stack 110 is the ratio of the height h1 to the width of the narrowest feature of the remaining portion of the multilayer stack 110, which is the width w1 at this step of processing. In addition, as shown in FIG. 2B, the trenches TR1 expose the side surfaces of the remaining portions of the multilayer stack 110. That is to say, the sidewalls of the trenches TR1 are defined by the remaining portions of the multilayer stack 110. In the illustrated embodiment, the trenches TR1 completely expose the side surfaces of the remaining portions of the multilayer stack 110. That is to say, the trenches TR1 expose the side surfaces of all layers (e.g., all of the insulating layers 112 and all of the sacrificial layers 114) in the remaining portions of the multilayer stack 110. However, the disclosure is not limited thereto. In some alternative embodiments, the trenches TR1 partially expose the side surfaces of the remaining portions of the multilayer stack 110. In some embodiments, the side surfaces of the insulating layers 112 are substantially coplanar or flush with the side surfaces of the sacrificial layers 114 in the current step.

In some embodiments, the method for forming the trenches TR1 includes a lithography process and an etching process (e.g., an anisotropic etching process). Since the substrate 100 has sufficient etching selectivity with respect to the materials in the multilayer stack 110, the substrate 100 may remain substantially intact during the etching process. In some embodiments where the substrate 100 is formed of silicon carbide, the insulating layers 112 are formed of silicon oxide, and the sacrificial layers 114 are formed of silicon nitride, the trenches TR1 are formed by a dry etch using a fluorine-based gas (e.g., $C_4F_6$) mixed with hydrogen (e.g., $H_2$) or oxygen (e.g., $O_2$) gas.

Figure 3A:
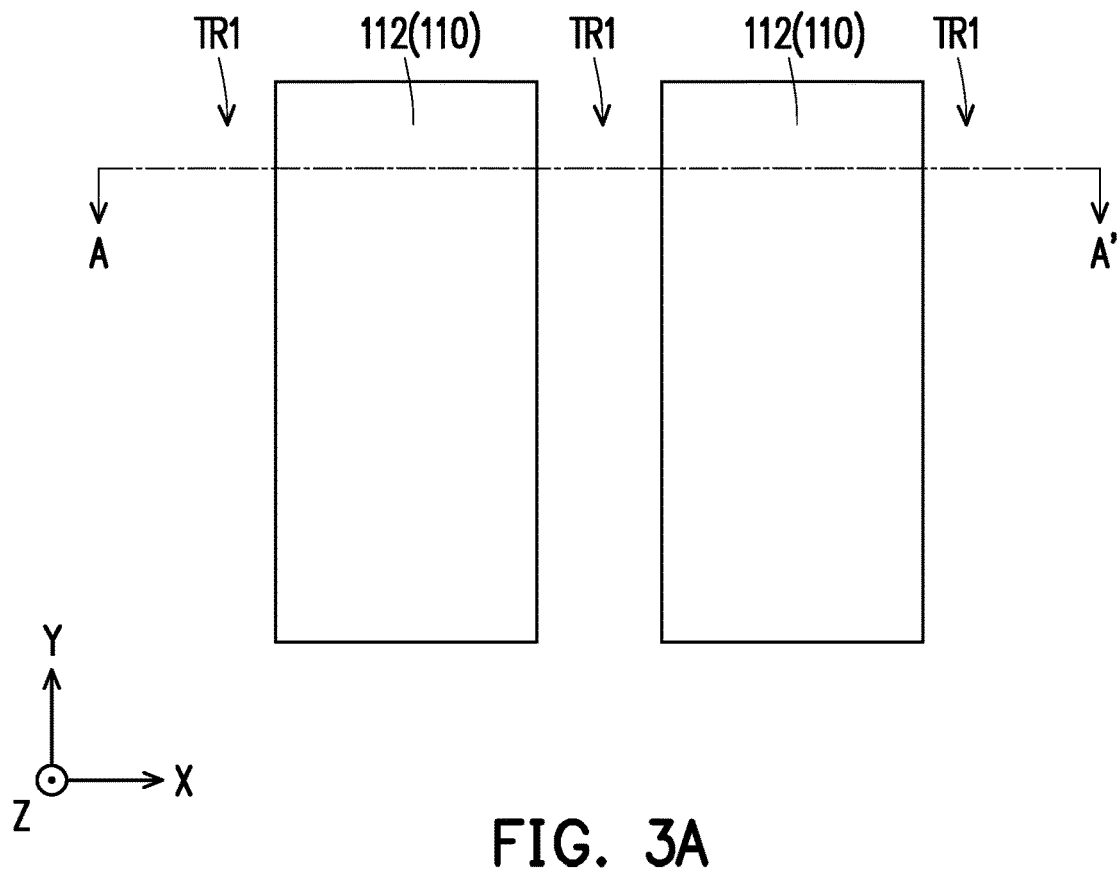
Figure 3B:
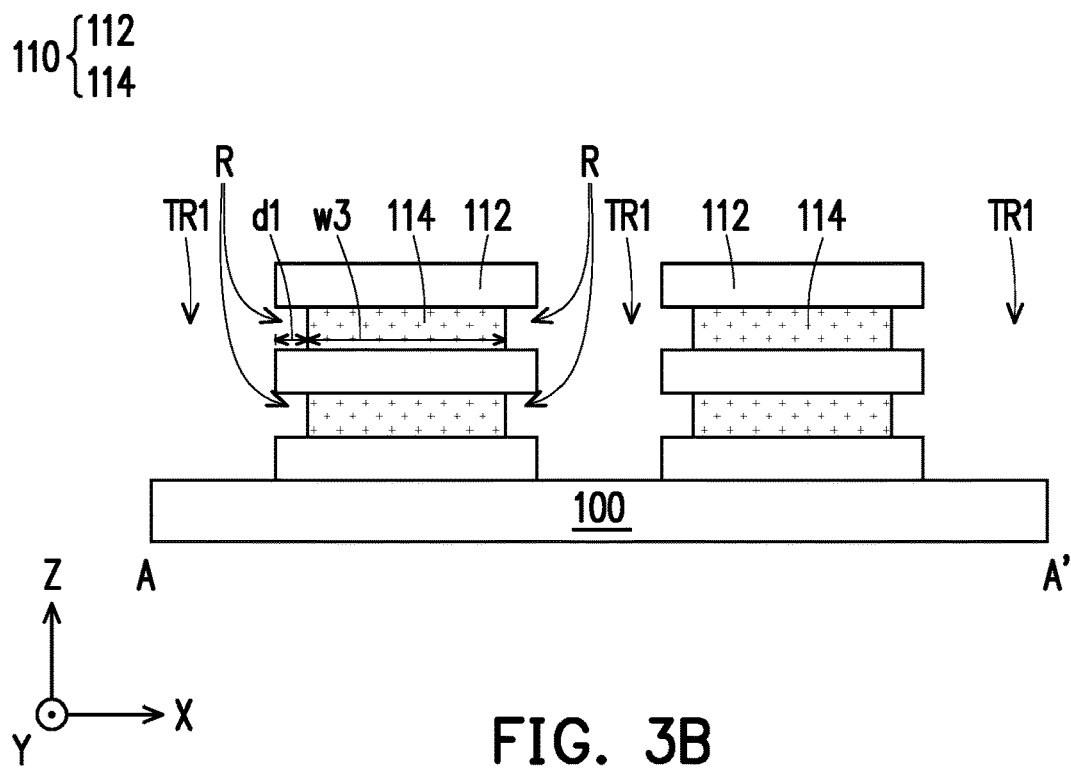

Referring to FIG. 3A and FIG. 3B, the sacrificial layers 114 in the remaining portions of the multilayer stack 110 are laterally recessed with respect to the insulating layers 112 in the remaining portions of the multilayer stack 110. As shown in FIG. 3B, portions of the sacrificial layers 114 exposed by the trenches TR1 are removed to form recesses R. Each of the recesses R is formed between two adjacent insulating layers 112. Each of the recesses R is connected to (e.g., in spatial communication with) the corresponding trench TR1. From another point of view, as shown in FIG. 3B, the side surfaces of the sacrificial layers 114 are exposed by the recesses R and the trenches TR1, and the exposed side surfaces of the sacrificial layers 114 are no longer coplanar with the exposed side surfaces of the insulating layers 112, but are laterally recessed from the exposed side surfaces of the insulating layers 112. Although the exposed side surfaces of the sacrificial layers 114 are illustrated in FIG. 3B as being straight, the side surfaces may be concave or convex.

In some embodiments, a method for laterally recessing the sacrificial layers 114 includes an etching process, such as an isotropic etching process. During such etching process, the insulating layers 112 may be barely etched as having sufficient etching selectivity with respect to the sacrificial layers 114. That is to say, the etching process used to form the recesses R is one that is selective to the material of the sacrificial layers 114 (e.g., selectively etches the material of the sacrificial layers 114 at a faster rate than the material of the insulating layers 112). From another point of view, since the substrate 100 has sufficient etching selectivity with respect to the materials in the multilayer stack 110, the substrate 100 may remain substantially intact during such etching process. In some embodiments where the substrate 100 is formed of silicon carbide, the insulating layers 112 are formed of silicon oxide, and the second sacrificial layers 114 are formed of silicon nitride, the trenches TR1 are expanded to form the recesses R by a wet etch using phosphoric acid (e.g., $H_3PO_4$). However, the embodiments of the disclosure are not limited thereto. In some alternative embodiments, a dry etch selective to the material of the sacrificial layers 114 may be used.

After formation, each of the recesses R has a depth dl extending past the sidewalls of the insulating layers 112 along the direction X. Timed etching processes may be used to stop the etching of the recesses R after the recesses R reach a desired depth dl. In some embodiments, the depth dl of the recesses R is in the range of about 5 nm to about 20 nm. From another point of view, forming the recesses R reduces the width of the sacrificial layers 114. In some embodiments, each of the sacrificial layers 114 has a width w3 in the range of about 20 nm to about 100 nm along the direction X after forming the recesses R. As noted above, the aspect ratio (AR) of each remaining portion of the multilayer stack 110 is the ratio of the height h1 to the width of the narrowest feature of the remaining portion of the multilayer stack 110, which is the width w3 at this step of processing. Forming the recesses R thus increases the aspect ratio of each remaining portion of the multilayer stack 110.

Figure 4A:
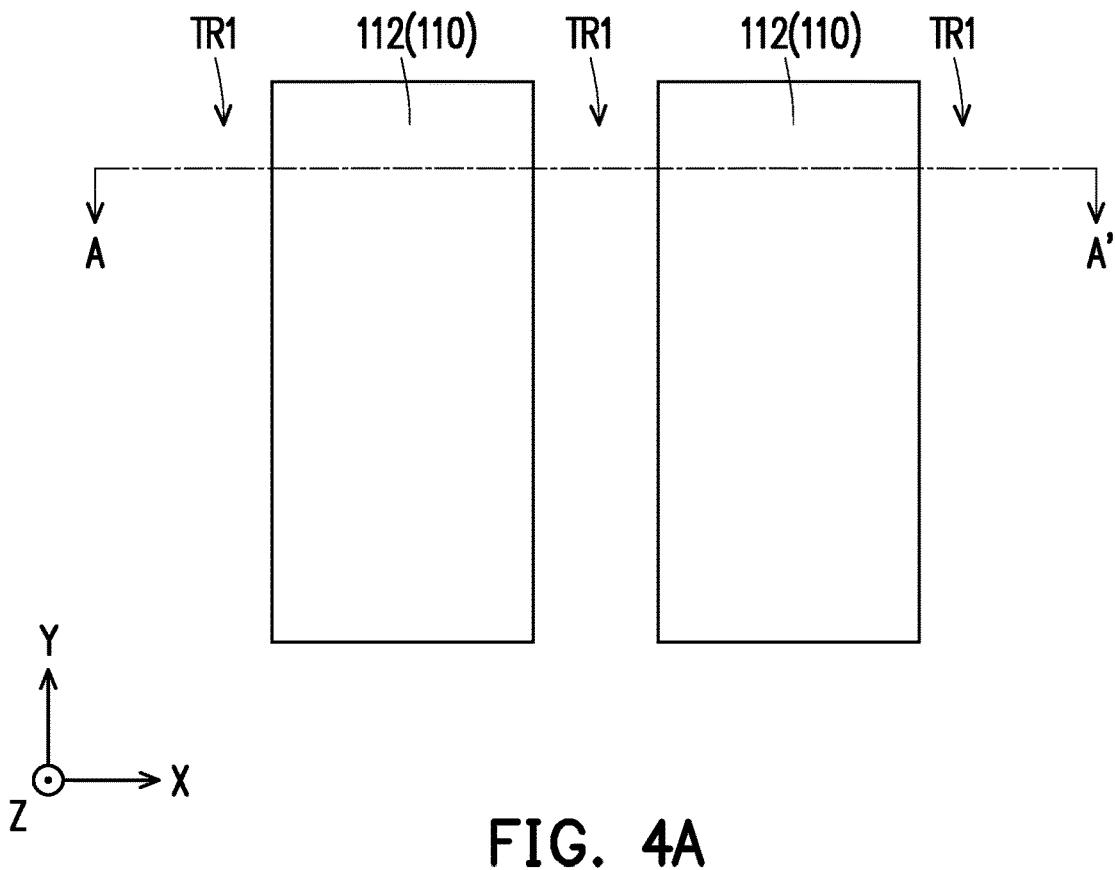
Figure 4B:
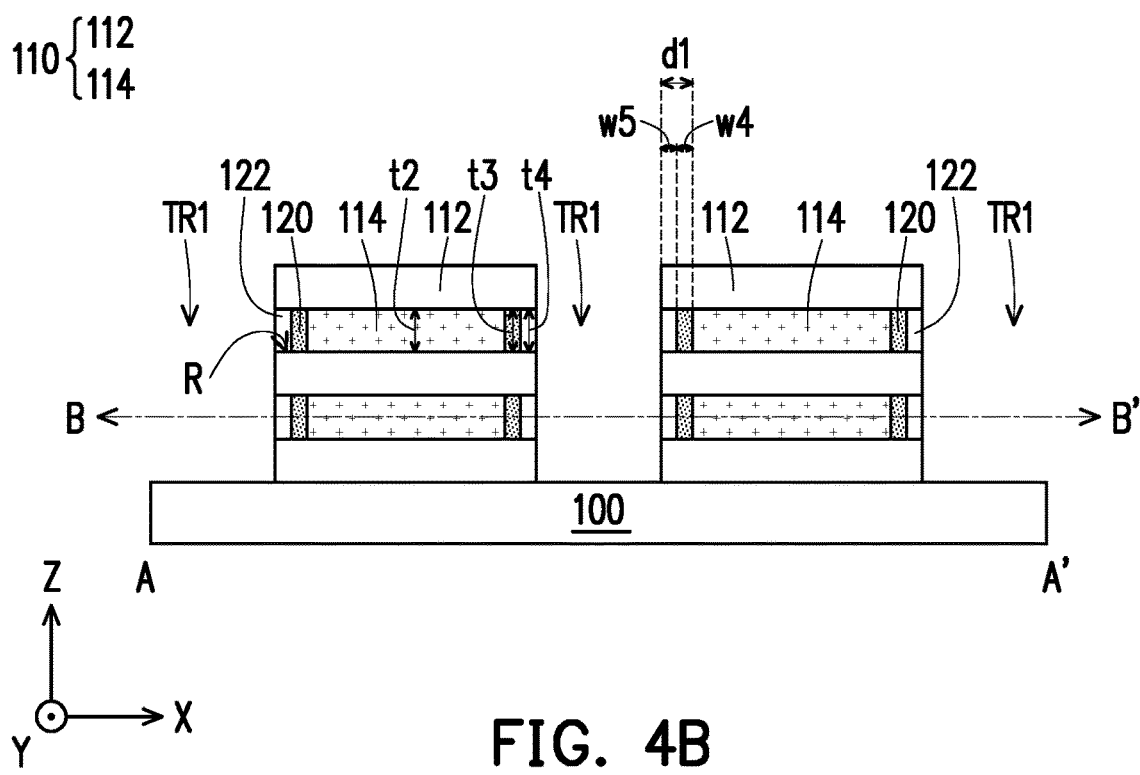
Figure 4C:
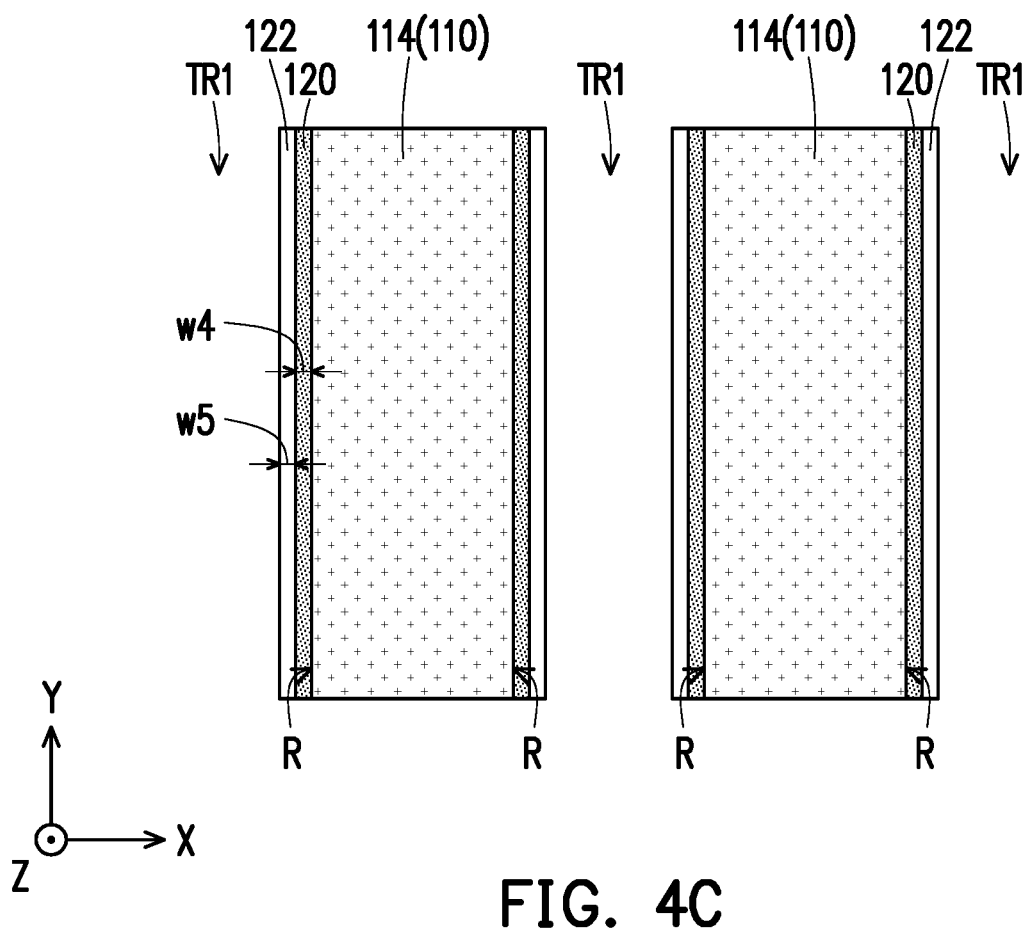

Referring to FIG. 4A, FIG. 4B, and FIG. 4C, ferroelectric layers 120 are formed in the recesses R. In detail, as shown in FIG. 4B and FIG. 4C, each of the ferroelectric layers 120 is formed within one of the recesses R in a one-to-one relationship. The ferroelectric layer 120 is formed to cover or contact the side surface of the corresponding sacrificial layer 114 exposed by the corresponding recess R. As such, in each remaining portion of the multilayer stack 110, the adjacent ferroelectric layers 120 along the direction X are laterally spaced apart from each other by the corresponding sacrificial layer 114. Further, as shown in FIG. 4B, one of the sacrificial layers 114 and the corresponding ferroelectric layers 120 are at substantially the same level in each remaining portion of the multilayer stack 110. Herein, when elements are described as "at substantially the same level", the elements are formed at substantially the same height. From another point of view, as shown in FIG. 4B, the ferroelectric layers 120 are each embedded between two adjacent insulating layers 112. In other words, the ferroelectric layers 120 along the direction Z are vertically spaced apart from each other by the corresponding insulating layer 112.

In some embodiments, the ferroelectric layers 120 are formed by the following steps. First, a ferroelectric material is formed over the substrate 100 to fill in the recesses R between the insulating layers 112. In some embodiments, the ferroelectric material not only fills the recesses R, but also further covers the side surfaces of the insulating layers 112 exposed by the trenches TR1, the top surface of the topmost insulating layer 112, and the top surface of the substrate 100 exposed by the trenches TR1. In some embodiments, the method for forming the ferroelectric material includes a deposition process, such as a CVD process or an ALD process. Thereafter, the portions of the ferroelectric material covering the side surfaces of the insulating layers 112 exposed by the trenches TR1, the top surface of the topmost insulating layer 112, and the top surface of the substrate 100 exposed by the trenches TR1 are removed, so as to form the separate and disconnected ferroelectric layers 120. In some embodiments, the method for removing some portions of the ferroelectric material includes performing an isotropic etching process. However, the disclosure is not limited thereto. In some alternative embodiments, an anisotropic etching process is performed followed by performing an isotropic etching process to remove some portions of the ferroelectric material.

In some embodiments, the ferroelectric layers 120 include a ferroelectric material that is capable of switching between two different polarization directions by applying appropriate voltage differentials across the ferroelectric layers 120. For example, the polarization of a ferroelectric layer 120 changes due to an electric field resulting from applying the voltage differential. In some embodiments, the ferroelectric material of the ferroelectric layers 120 includes hafnium zirconium oxide (e.g., HZO), silicon-doped hafnium oxide (e.g., HSO), hafnium silicon oxide (e.g., HfSiO), hafnium lanthanum oxide (e.g., HfLaO), hafnium oxide (e.g., $HfO_2$), hafnium zirconium oxide (e.g., $HfZrO_2$), zirconium oxide (e.g., $ZrO_2$), or $HfO_2$ doped by lanthanum (e.g., La), yttrium (e.g., Y), silicon (e.g., Si), or germanium (e.g., Ge). However, the disclosure is not limited thereto. In some alternative embodiments, the ferroelectric material of the ferroelectric layers 120 may be a high-k dielectric material, such as a hafnium (Hf) based dielectric material, or the like. For example, the ferroelectric material may be a hafnium-containing compound, such as hafnium zirconium oxide (e.g., HfZnO), hafnium aluminum oxide (e.g., HfAlO), hafnium lanthanum oxide (e.g., HfLaO), hafnium cerium oxide (e.g., HfCeO), hafnium oxide (e.g., HfO), hafnium gadolinium oxide (e.g., HfGdO), hafnium silicon oxide (e.g., HfSiO), hafnium zirconium lanthanum oxide (e.g., HfZrLaO), hafnium zirconium gadolinium oxide (e.g., HfZrGdO), hafnium zirconium yttrium oxide (e.g., HfZrYO), hafnium zirconium cerium oxide (e.g., HfZrCeO), hafnium zirconium strontium oxide (e.g., HfZrSrO), or the like. In addition, the hafnium-containing compound may further be doped by some dopants, such as lanthanum (e.g., La), yttrium (e.g., Y), silicon (e.g., Si), germanium (e.g., Ge), cerium (e.g., Ce), gadolinium (e.g., Gd), strontium (e.g., Sr), or the like, or a combination thereof. By doping these dopants in the hafnium-containing compound, an orthorhombic lattice structure can be achieved in the ferroelectric layers 120. In some embodiments, the hafnium-containing compound with the orthorhombic lattice structure has a desired ferroelectric property to achieve the switchable performance of the ferroelectric layers 120 in the memory device. In addition, by including the dopants, an orthorhombic lattice structure in the ferroelectric layers 120 may be achieved relatively easily (e.g., at a lower temperature), and the ferroelectric layers 120 may be formed within the relatively low thermal budget of back-end-of-line (BEOL) processes (e.g., at a temperature that does not damage front end of line (FEOL) features).

As shown in the plan view of FIG. 4C, the ferroelectric layers 120 laterally extend along the direction Y. In some embodiments, the ferroelectric layers 120 have a thickness t3 (see, e.g., FIG. 4B) substantially the same as the thickness t2 of the sacrificial layers 114 (see, e.g., FIG. 4B) along the direction Z. In some embodiments, the thickness t3 of the ferroelectric layers 120 is in the range of about 3 nm to about 15 nm. In some embodiments, along the direction X, the ferroelectric layers 120 have a width w4 (see, e.g., FIG. 4C) less than the depth d1 of the recess R (see, e.g., FIG. 4B). That is to say, the recesses R are partially occupied by the corresponding ferroelectric layers 120. Timed etching processes may be used to stop the etching of the ferroelectric layers 120 after the ferroelectric layers 120 reach a desired width w4. In some embodiments, the width w4 of the ferroelectric layers 120 is in the range of about 3 nm to about 15 nm along the direction X.

With continued reference to FIG. 4B and FIG. 4C, channel layers 122 are formed in the recesses R. In detail, as shown in FIG. 4B and FIG. 4C, each of the channel layers 122 is formed within one of the recesses R in a one-to-one relationship. The channel layer 122 is formed to cover or contact the side surface of the corresponding ferroelectric layer 120 exposed by the corresponding recess R. As such, in each remaining portion of the multilayer stack 110, the corresponding channel layers 122 along the direction X are laterally spaced apart from each other by the corresponding ferroelectric layers 120 and the corresponding sacrificial layer 114. Further, as shown in FIG. 4B, one of the sacrificial layers 114, the corresponding ferroelectric layers 120, and the corresponding channel layers 122 are at substantially the same level in each remaining portion of the multilayer stack 110. From another point of view, as shown in FIG. 4B, the channel layers 122 are each embedded between two adjacent insulating layers 112. In other words, the channel layers 122 along the direction Z are vertically spaced apart from each other by the corresponding insulating layers 112.

In some embodiments, the channel layers 122 are formed by the following steps. First, a channel material is formed over the substrate 100 to fill in the recesses R between the insulating layers 112. In some embodiments, the channel material not only fills up the recesses R, but also further covers the side surfaces of the insulating layers 112 exposed by the trenches TR1, the top surface of the topmost insulating layer 112, and the top surface of the substrate 100 exposed by the trenches TR1. In some embodiments, the method for forming the channel material includes a deposition process, such as a CVD process or an ALD process. Thereafter, the portions of the channel material covering the side surfaces of the insulating layers 112 exposed by the trenches TR1, the top surface of the topmost insulating layer 112, and the top surface of the substrate 100 exposed by the trenches TR1 are removed, so as to form the separate and disconnected channel layers 122. In some embodiments, the method for removing some portions of the channel material includes performing an anisotropic etching process.

In some embodiments, the channel material of the channel layers 122 includes a metal oxide (or oxide semiconductor), such as an indium-based oxide material (e.g., indium gallium zinc oxide (e.g., IGZO)). Other suitable materials for the channel layers 122 include zinc oxide (e.g., ZnO), indium tungsten oxide (e.g., InWO), tungsten oxide (e.g., WO), tantalum oxide (e.g., TaO), and molybdenum oxide (e.g., MoO).

As shown in the plan view of FIG. 4C, the channel layers 122 laterally extend along the direction Y, and the ferroelectric layers 120 are disposed between the corresponding channel layer 122 and the corresponding sacrificial layer 114. In some embodiments, the channel layers 122 have a thickness t4 (see, e.g., FIG. 4B) substantially the same as the thickness t2 of the sacrificial layers 114 (see, e.g., FIG. 4B) along the direction Z. In some embodiments, the thickness t4 of the channel layers 122 is in the range of about 5 nm to about 15 nm. In some embodiments, along the direction X, the channel layers 122 have a width w5 (see, e.g., FIG. 4C) less than the depth d1 of the recess R (see, e.g., FIG. 4B). In some embodiments, the width w5 of the channel layers 122 is in the range of about 5 nm to about 15 nm along the direction X.

In some embodiments, as shown in FIG. 4B, the side surface of each channel layer 122 exposed by the corresponding trench TR1 is substantially coplanar or level with the side surfaces of the adjacent insulating layers 112 exposed by the corresponding trench TR1. In such a case, a sum of the width w4 of the ferroelectric layers 120 (see, e.g., FIG. 4C) and the width w5 of the channel layers 122 (see, e.g., FIG. 4C) is substantially the same as the depth d1 of the recess R. However, the disclosure is not limited thereto. In some alternative embodiments, the side surface of each channel layer 122 exposed by the corresponding trench TR1 is slightly recessed from the side surfaces of the adjacent insulating layers 112 exposed by the corresponding trench TR1 by a non-zero distance. The non-zero distance ranges from about 1 nm to about 5 nm, for example.

Figure 5A:
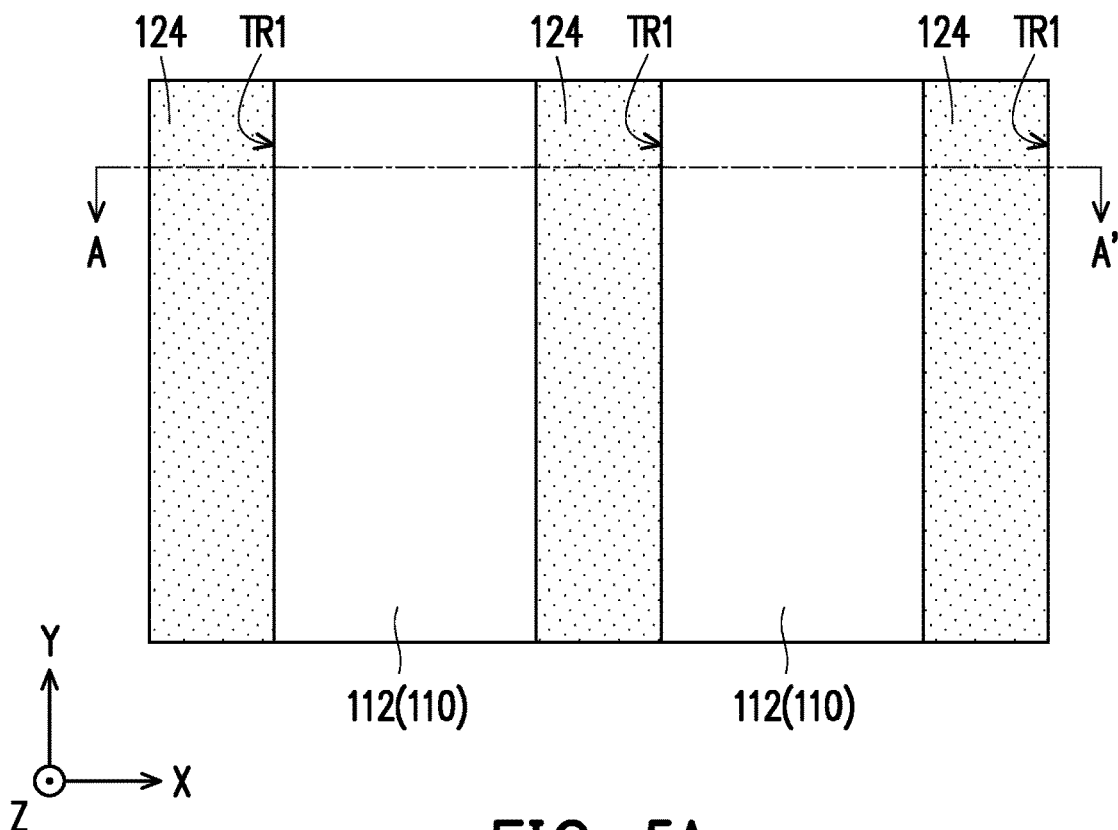
Figure 5B:
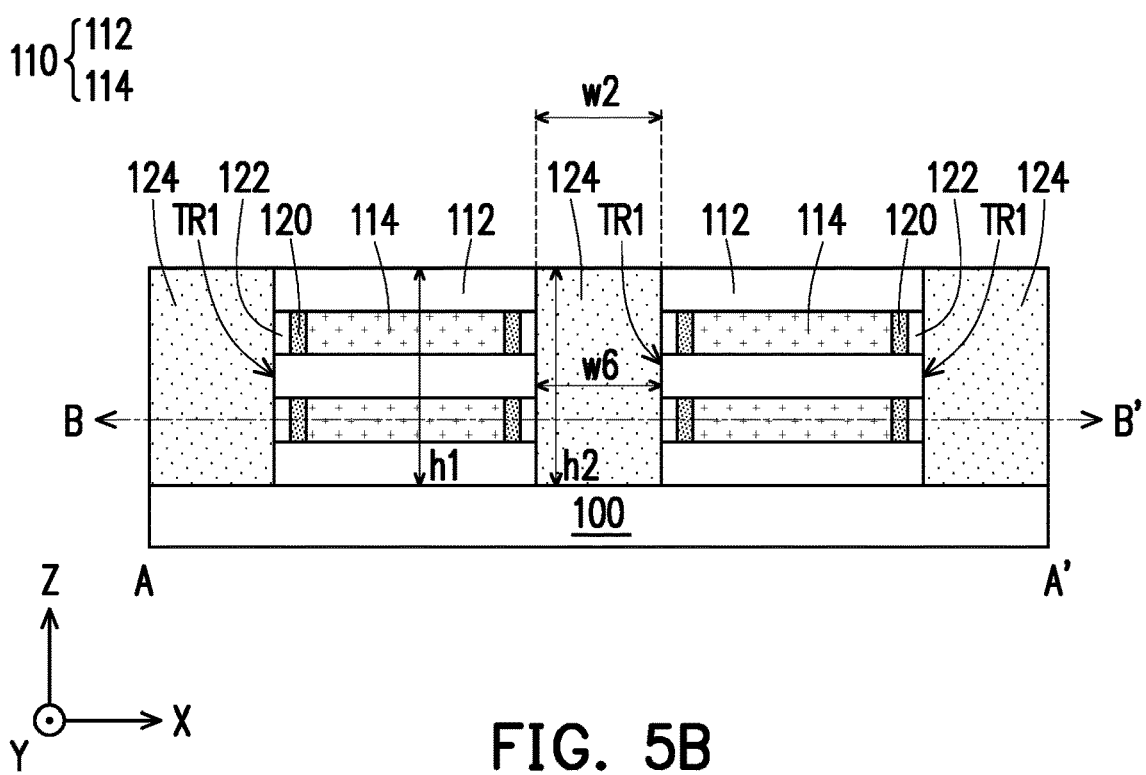
Figure 5C:
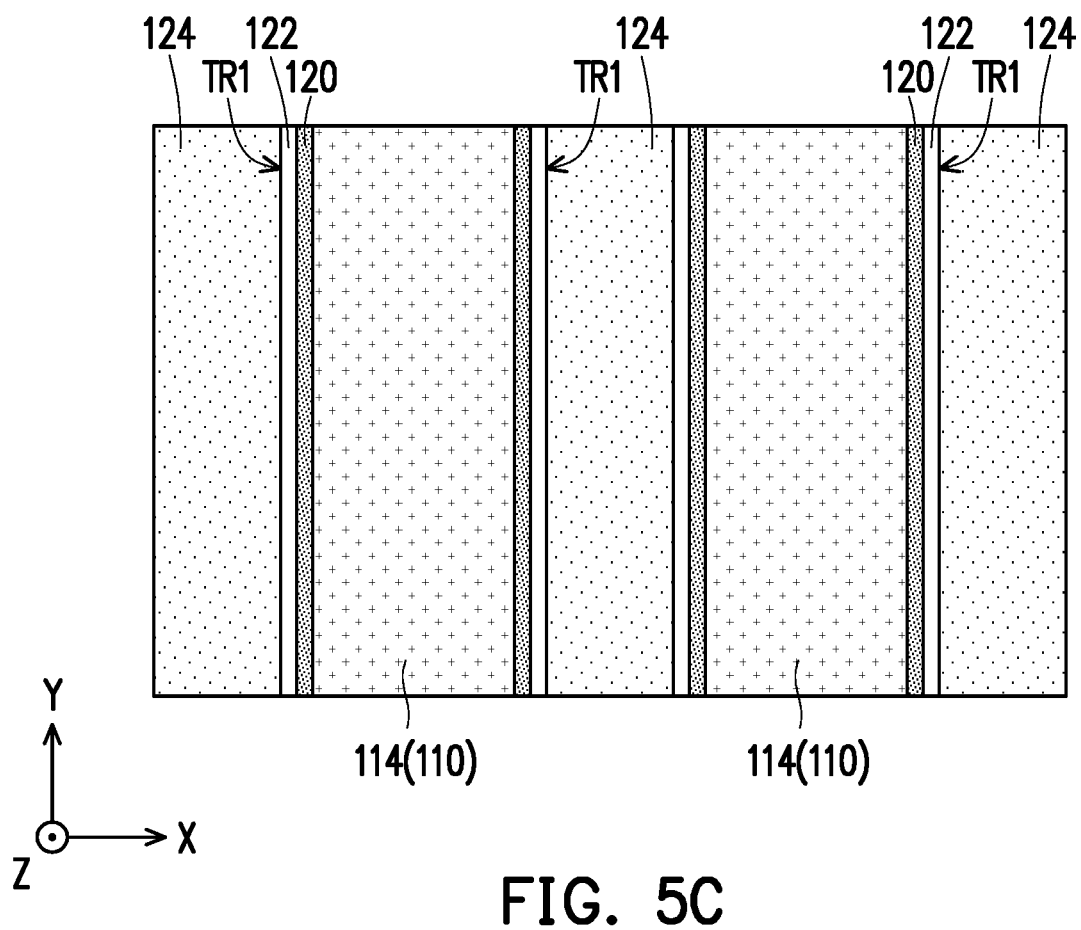

Referring to FIG. 5A, FIG. 5B, and FIG. 5C, after forming the channel layers 122, dielectric walls 124 are formed to fill up the trenches TR1. As shown in FIG. 5A, FIG. 5B, and FIG. 5C, the dielectric walls 124 are in contact with the side surfaces of the insulating layers 112 exposed by the trenches TR1 and the side surfaces of the channel layers 122 exposed by the trenches TR1. In embodiments where the side surface of each channel layer 122 exposed by the corresponding trench TR1 is substantially coplanar or level with the side surfaces of the adjacent insulating layers 112 exposed by the corresponding trench TR1, the side surface of the dielectric wall 124 in contact with the side surfaces of the insulating layers 112 and the side surface of the channel layer 122 exposed by the corresponding trench TR1 has a substantially smooth profile. In some embodiments, as shown in FIG. 5A, FIG. 5B, and FIG. 5C, each side surface of the dielectric wall 124 in contact with the side surfaces of the insulating layers 112 and the side surface of the channel layers 122 exposed by the corresponding trench TR1 is substantially straight. However, the disclosure is not limited thereto. In embodiments where the side surface of each channel layer 122 exposed by the corresponding trench TR1 is slightly recessed from the side surfaces of the adjacent insulating layers 112 exposed by the corresponding trench TR1, the side surface of the dielectric wall 124 in contact with the side surfaces of the insulating layers 112 and the side surface of the channel layers 122 exposed by the corresponding trench TR1 has an uneven profile. In such a case, the dielectric walls 124 may have laterally protruding portions in contact with the side surfaces of the corresponding channel layers 122.

In some embodiments, as shown in FIG. 5B, the bottom surfaces of the dielectric walls 124 are in contact with the top surface of the substrate 100 exposed by the trenches TR1. However, the disclosure is not limited thereto. In embodiments where the trenches TR1 vertically extend through some but not all layers of the multilayer stack 110, the bottom surfaces of the dielectric walls 124 are in contact with the remaining portions of the multilayer stack 110.

In some embodiments, the dielectric walls 124 are formed by the following steps. After forming the channel layers 122, a dielectric material is formed to fill the trenches TR1. The dielectric material may include silicon nitride, silicon oxide, silicon oxynitride, phosphosilicate glass (PSG), borosilicate glass (BSG), boron-doped phosphosilicate glass (BPSG), or the like, or a combination thereof, and may be formed by a suitable deposition process, such as a CVD process or an ALD process. After the dielectric material is formed, a planarization process, such as a chemical mechanical planarization (CMP) process, an etching process, or a combination thereof, may be performed to remove portions of the dielectric material outside the trenches TR1. In some embodiments, the portions of the dielectric material removed by the planarization process are over the top surface of the topmost insulating layer 112. That is to say, the planarization process exposes the multilayer stack 110 such that the top surface of the multilayer stack 110 (e.g., the top surface of the topmost insulating layer 112) and the top surfaces of the remaining portions of the dielectric material are substantially coplanar or level with one another after the planarization process is complete. The remaining portions of the dielectric material in the trenches TR1 form the dielectric walls 124.

As shown in the plan view of FIG. 5C, the dielectric walls 124 laterally extend along the direction Y, and each of the channel layers 122 is disposed between the corresponding dielectric wall 124 and the corresponding ferroelectric layer 120. In some embodiments, the dielectric walls 124 (see, e.g., FIG. 5C) have a height h2 substantially the same as the overall height h1 of the multilayer stack 110 (see, e.g., FIG. 5C) along the direction Z. In some embodiments, the height h2 of the dielectric walls 124 is in the range of about 1000 nm to about 10000 nm. In some embodiments, the dielectric walls 124 (see, e.g., FIG. 5B) have a width w6 substantially the same as the width w2 of the trenches TR1 (see, e.g., FIG. 5B) along the direction X. In some embodiments, the width w6 of the dielectric walls 124 is in the range of about 50 nm to about 200.

Figure 6A:
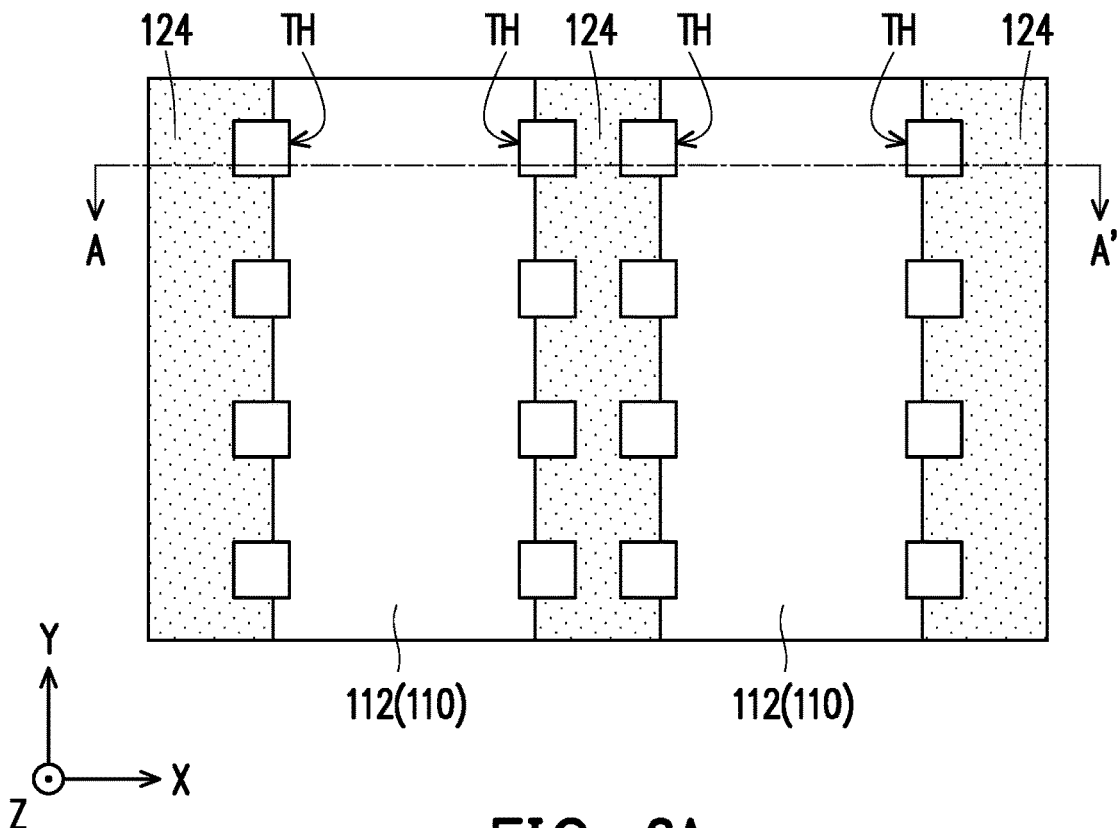
Figure 6B:
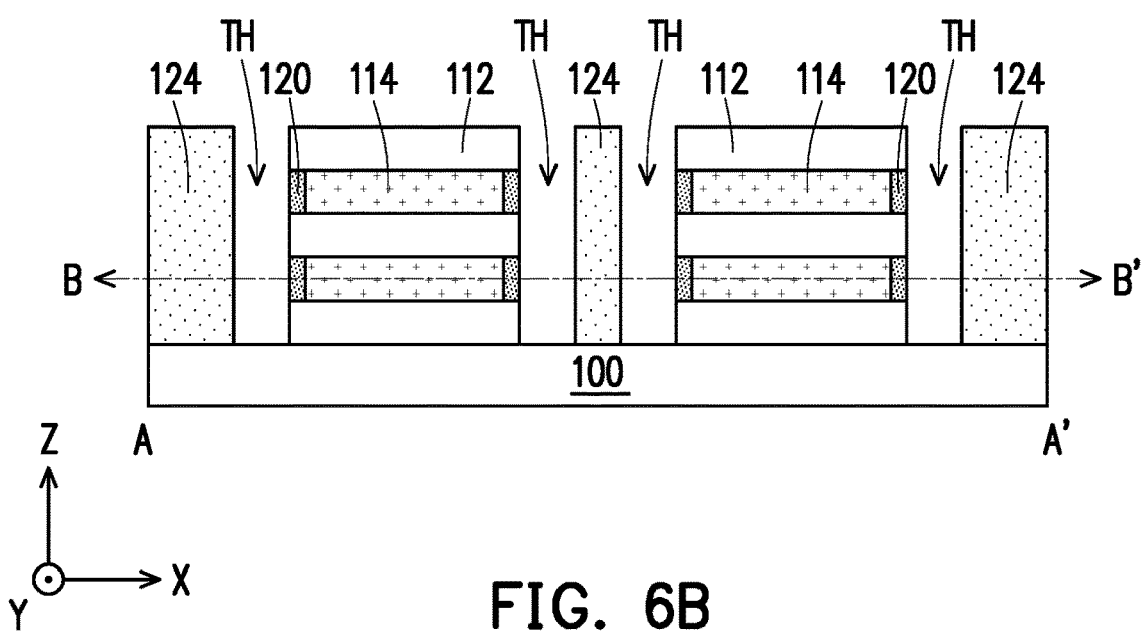
Figure 6C:
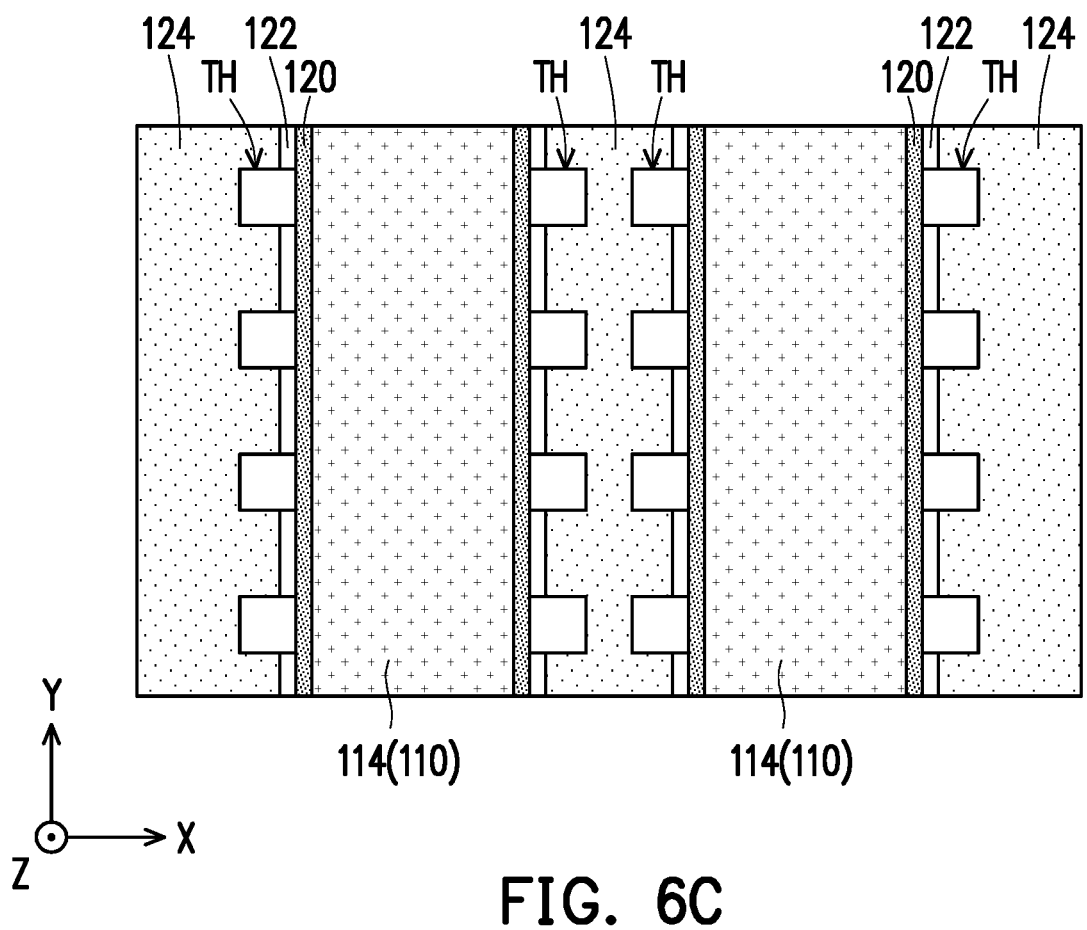

Referring to FIG. 6A, FIG. 6B, and FIG. 6C, through holes TH are formed in the dielectric walls 124, the insulating layers 112, and the channel layers 122. In detail, as shown in FIG. 6A, FIG. 6B, and FIG. 6C, each through hole TH penetrates through the corresponding dielectric wall 124, the corresponding insulating layers 112, and the corresponding channel layers 122 along the direction Z to expose the substrate 100. That is to say, each through hole TH vertically extends through the corresponding dielectric wall 124, the corresponding insulating layers 112, and the corresponding channel layers 122. Further, as shown in FIG. 6C, the through holes TH penetrate through the channel layers 122 to cut off the channel layers 122, such that each of the channel layers 122 is rendered as a discontinuous channel layer. However, the disclosure is not limited thereto. In some alternative embodiments, the through holes TH may penetrate through the channel layers 122 without cutting off the channel layers 122. In such case, each of the channel layers 122 still is a continuous channel layer. In addition, as shown in FIG. 6B, after forming the through holes TH, the side surfaces of the ferroelectric layers 120 in contact with the channel layers 122 are exposed by the through holes TH. However, the disclosure is not limited thereto. In embodiments where the through holes TH penetrate through the channel layers 122 without cutting off the channel layers 122, the ferroelectric layers 120 are not exposed by the through holes TH.

In some embodiments, the through holes TH are laterally separated from one another. As shown in FIG. 6A, FIG. 6B, and FIG. 6C, the through holes TH arranged in the same dielectric wall 124 are laterally separated from one another by the dielectric wall 124, the corresponding insulating layers 112, and the corresponding channel layers 122. From another point of view, as shown in FIG. 6A and FIG. 6C, the through holes TH are separately arranged as having multiple columns extending along the direction Y, and two adjacent columns of the through holes TH are spaced apart from each other along the direction X. The through holes TH in the same column are laterally separated from one another by the corresponding dielectric wall 124, the corresponding insulating layers 112, and the corresponding channel layers 122. The through holes TH in one of the adjacent columns of the through holes TH arranged in the same dielectric wall 124 are laterally separated from the through holes TH in another one of the adjacent columns by the dielectric wall 124.

In some embodiments, the through holes TH are formed by using a lithography process and an etching process. A mask pattern, such as patterned photoresist, may be formed over the multilayer stack 110. The etching process may then be performed by using the mask pattern as an etching mask to remove portions of the dielectric walls 124, the insulating layers 112, and the channel layers 122 so as to form the through holes TH. After the etching process is finished, the mask pattern (e.g., patterned photoresist) may be removed by a suitable removal process, such as ashing or stripping. In some embodiments, the etching process is an anisotropic etching process.

Figure 7A:
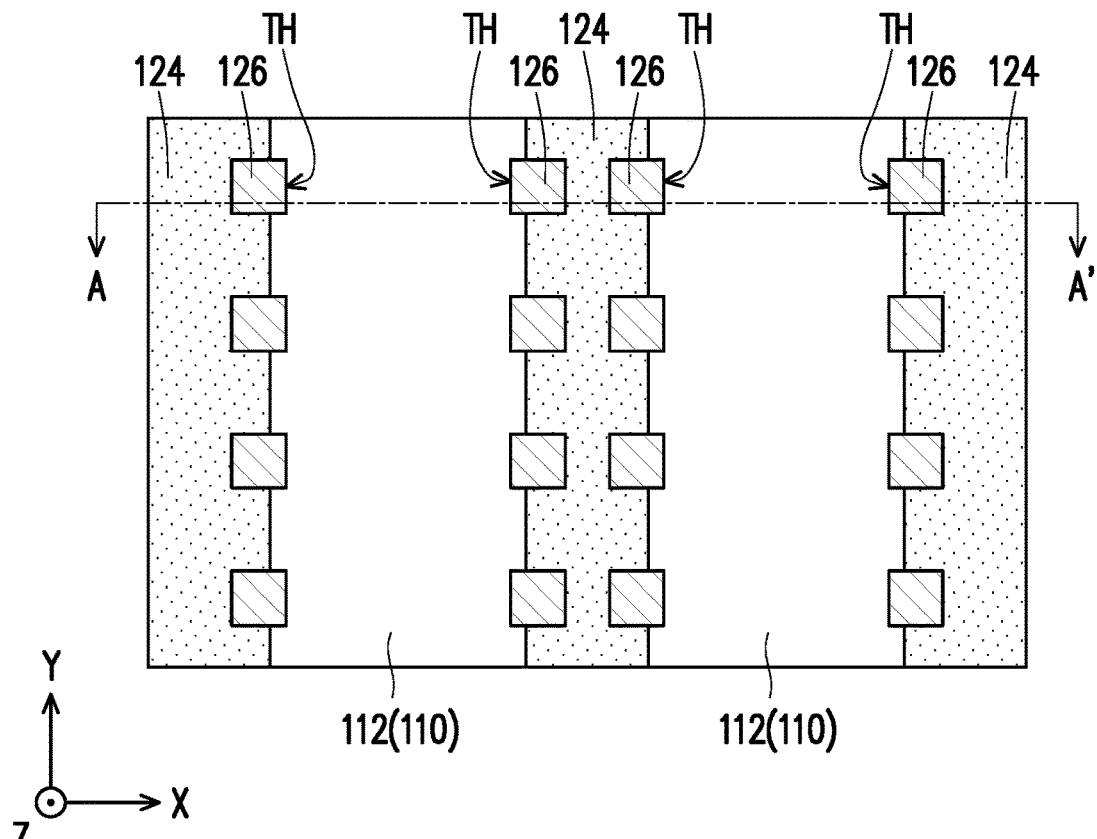
Figure 7B:
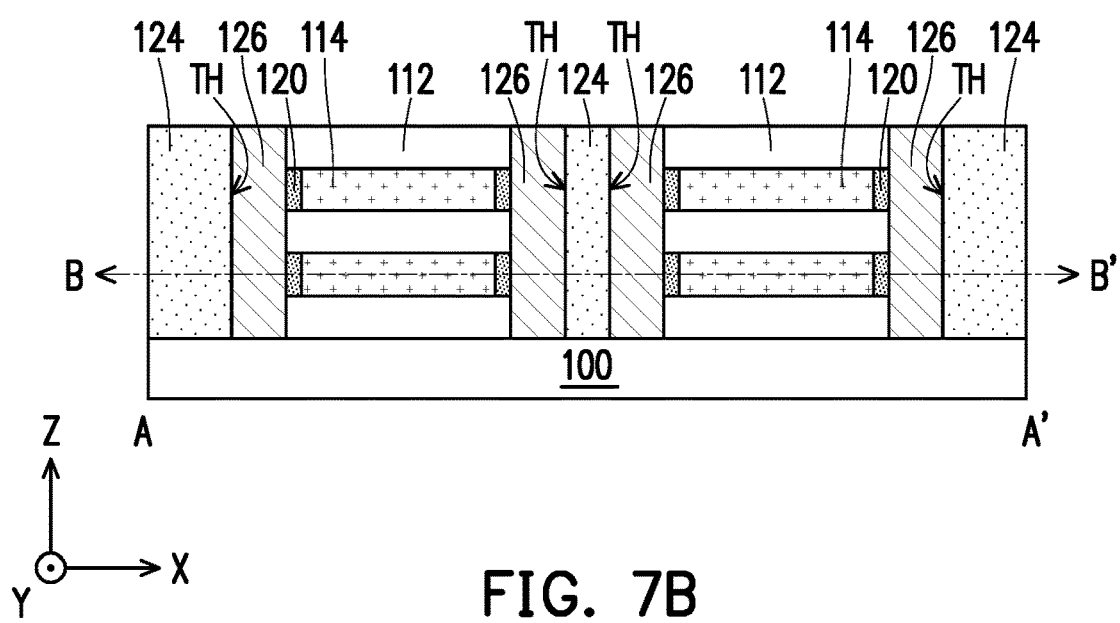
Figure 7C:
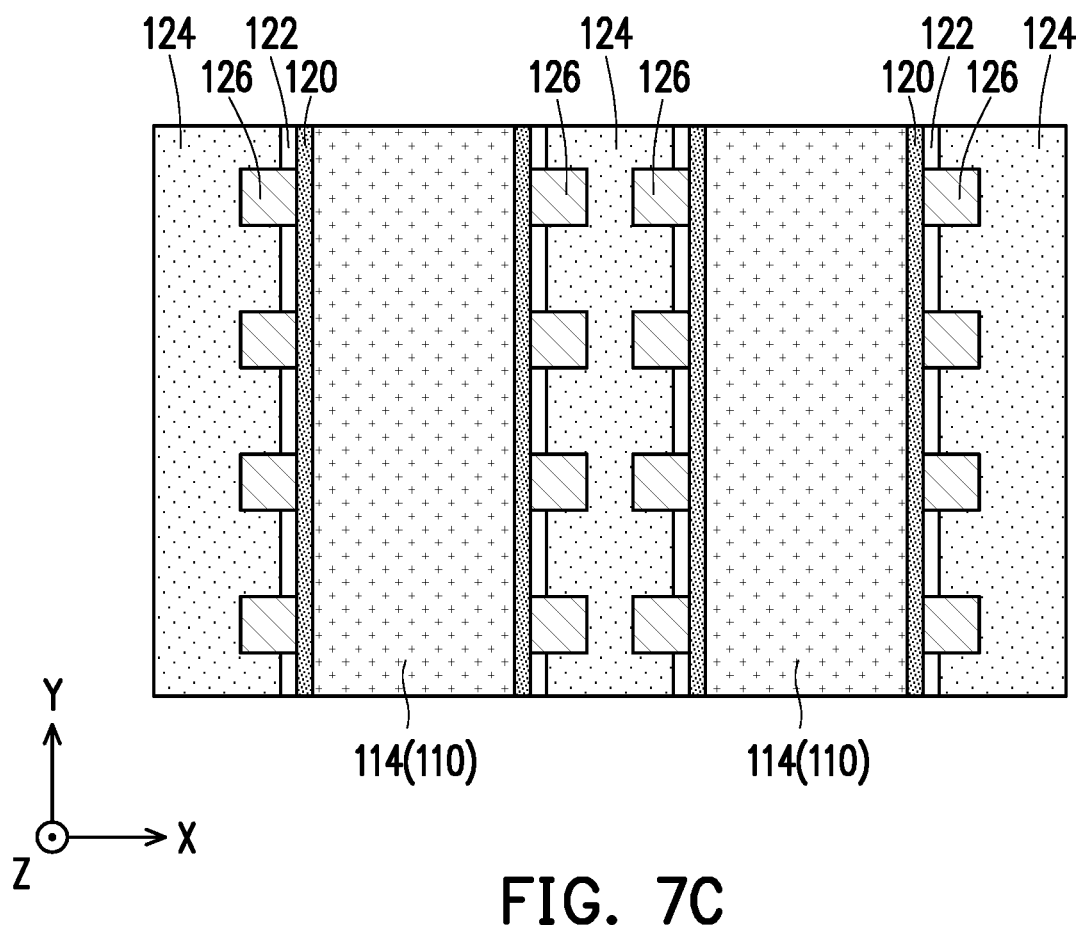

Referring to FIG. 7A, FIG. 7B, and FIG. 7C, conductive pillars 126 are formed to fill up the through holes TH. In detail, as shown in FIG. 7A, FIG. 7B, and FIG. 7C, each conductive pillar 126 penetrates through the corresponding dielectric wall 124, the corresponding insulating layers 112, and the corresponding channel layers 122 along the direction Z and reaches to the top surface of the substrate 100 exposed by the corresponding through hole TH. That is to say, each conductive pillar 126 vertically extends through the corresponding dielectric wall 124, the corresponding insulating layers 112, and the corresponding channel layers 122. In some embodiments, each conductive pillar 126 is formed to be in lateral contact with one of the corresponding channel layers 122 through more than one side surfaces. In the illustrated embodiment, as shown in FIG. 6C, since the through holes TH cut off the channel layers 122 to expose the side surfaces of the ferroelectric layers 120, two side surfaces of each conductive pillar 126 filling up the corresponding through hole TH are in lateral contact with one of the corresponding channel layers 122. From another point of view, the conductive pillars 126 filling up the through holes TH are in contact with the side surfaces of the ferroelectric layers 120 exposed by the corresponding through holes TH. However, the disclosure is not limited thereto. In embodiments where the through holes TH penetrate through the channel layers 122 without cutting off the channel layers 122, portions of each conductive pillar 126 are embedded in the corresponding channel layers 122. In such case, three side surfaces of each conductive pillar 126 filling up the corresponding through hole TH are in lateral contact with one of the corresponding channel layers 122. Although sixteen conductive pillars 126 are presented in FIG. 7A for illustrative purposes, those skilled in the art can understand that the number of the conductive pillars 126 may be more than what is depicted in FIG. 7A, and may be designated based on demand and/or design layout.

In some embodiments, the conductive pillars 126 are laterally separated from one another. As shown in FIG. 7A, FIG. 7B, and FIG. 7C, the conductive pillars 126 arranged in the same dielectric wall 124 are laterally separated from one another by the dielectric wall 124, the corresponding insulating layers 112, and the corresponding channel layers 122. From another point of view, as shown in FIG. 7A and FIG. 7C, the conductive pillars 126 are separately arranged in an array of rows and columns. In detail, the conductive pillars 126 are separately arranged as having multiple columns extending along the direction Y, and adjacent columns of the conductive pillars 126 are spaced apart from each other along the direction X. The conductive pillars 126 in the same column are laterally separated from one another by the corresponding dielectric wall 124, the corresponding insulating layers 112, and the corresponding channel layers 122. The conductive pillars 126 in one of the adjacent columns of the conductive pillars 126 arranged in the same dielectric wall 124 are laterally separated from the conductive pillars 126 in another one of the adjacent columns by the dielectric wall 124.

In some embodiments, the conductive pillars 126 are formed by the following steps. After forming the through holes TH, a conductive material is formed to fill the through holes TH. The conductive material may include copper, titanium, titanium nitride, tantalum, tantalum nitride, tungsten, ruthenium, aluminum, combinations thereof, or the like, and may be formed by a deposition process (e.g., a CVD process or a physical vapor deposition (PVD) process), a plating process, or a combination thereof. After the conductive material is formed, a planarization process, such as a CMP process, an etching process, or a combination thereof, may be performed to remove portions of the conductive material outside the through holes TH. In some embodiments, the portions of the conductive material removed by the planarization process are over the top surface of the topmost insulating layer 112 and the top surfaces of the dielectric walls 124. That is to say, the planarization process exposes the multilayer stack 110 and the dielectric walls 124, such that the top surface of the multilayer stack 110 (e.g., the top surface of the topmost insulating layer 112), the top surfaces of the dielectric walls 124, and the top surfaces of the remaining portions of the conductive material are substantially coplanar or level with one another after the planarization process is complete. The remaining portions of the conductive material in the through holes TH form the conductive pillars 126.

After forming the conductive pillars 126 in contact with the channel layers 122, the sacrificial layers 114 are subsequently replaced with gate layers 118 by a replacement process, which will be described in details in FIG. 8A to FIG. 10A, FIG. 8B to FIG. 10B, and FIG. 8C to FIG. 10C.

Figure 8A:
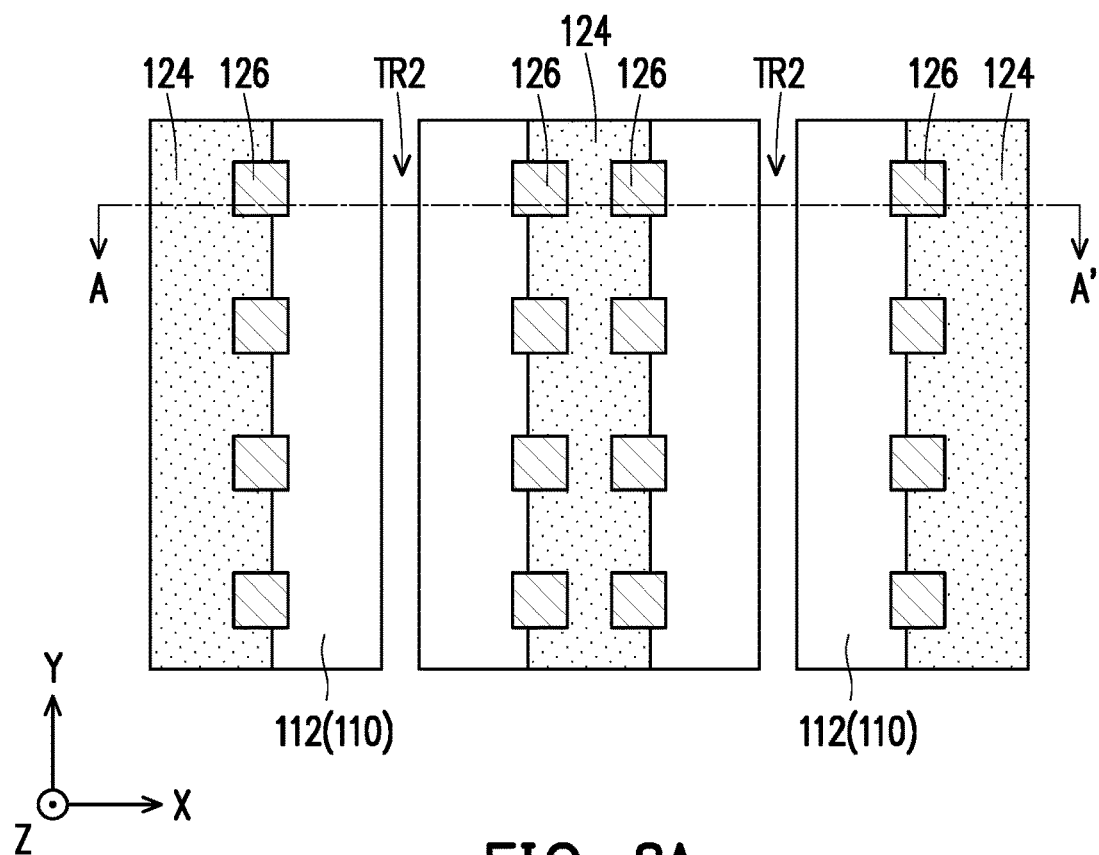
Figure 8B:
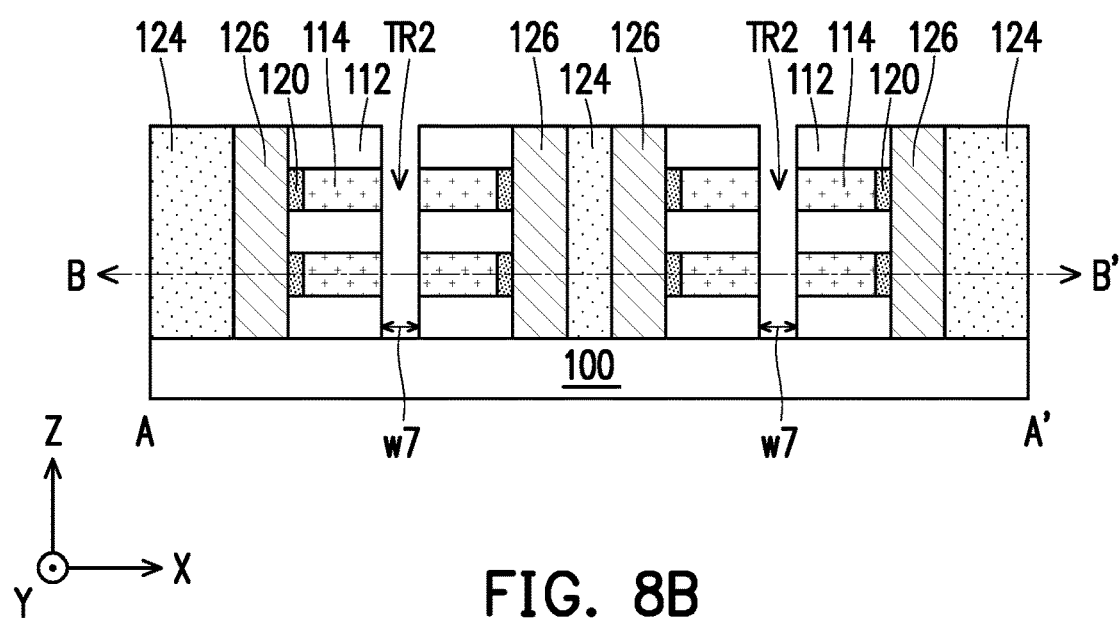
Figure 8C:
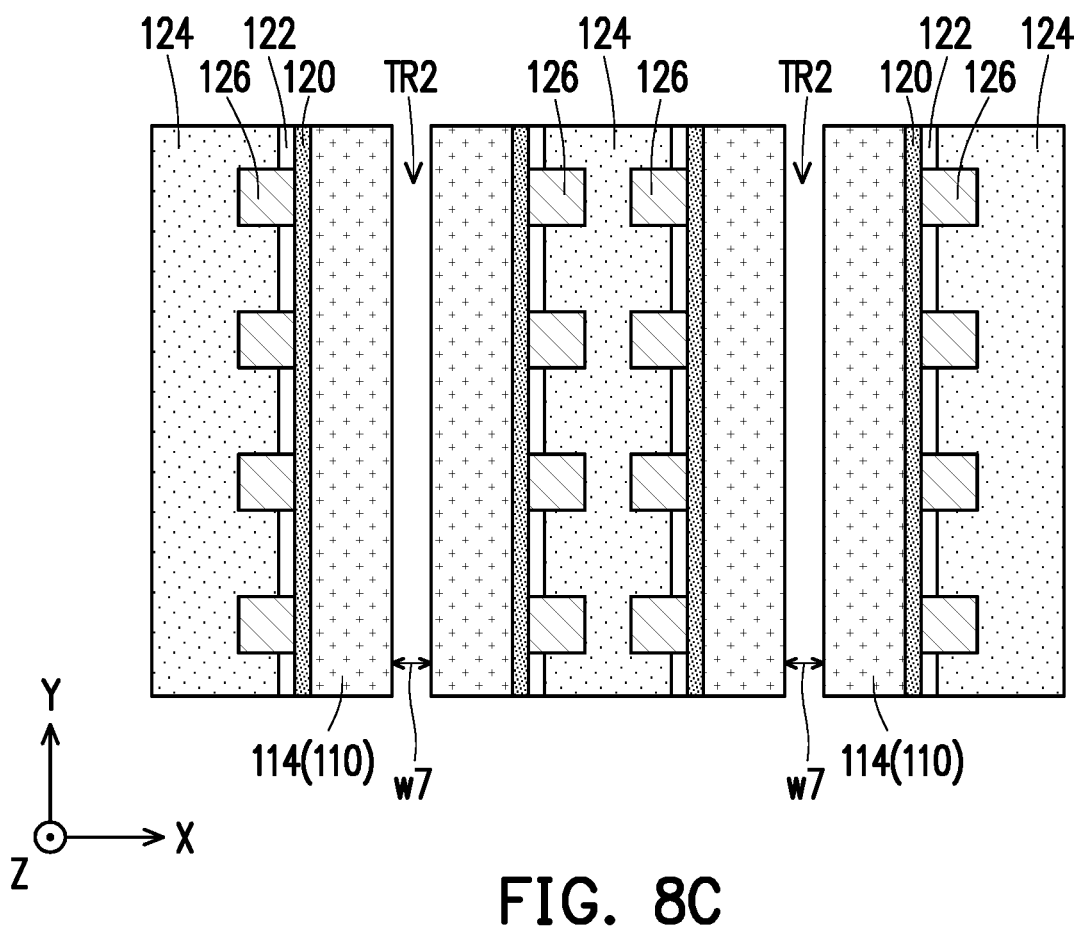

Referring to FIG. 8A, FIG. 8B, and FIG. 8C, trenches TR2 are formed in the multilayer stack 110. In the illustrated embodiment, the trenches TR2 penetrate through the remaining portions of the multilayer stack 110 rendered after forming the recesses R (as described with reference to FIG. 3A and FIG. 3B) along the direction Z. To avoid clutter and for ease of discussion, the remaining portions of the multilayer stack 110 rendered after forming the recesses R are referred to as the remaining portions of the multilayer stack 110 in the discussion hereinafter. In detail, each of the trenches TR2 is formed in one of the remaining portions of the multilayer stack 110 in a one-to-one relationship. From another point of view, in the illustrated embodiment, each of the trenches TR2 vertically extends through all layers (e.g., all of the insulating layers 112 and all of the sacrificial layers 114) of the corresponding remaining portion of the multilayer stack 110 to expose the substrate 100. That is to say, each remaining portion of the multilayer stack 110 can be regarded as being cut into two half portions by the corresponding trench TR2. However, the disclosure is not limited thereto. In some alternative embodiments, the trenches TR2 vertically extend through some but not all layers of the remaining portions of the multilayer stack 110. For example, the trenches TR2 may extend through all of the sacrificial layers 114 and expose the bottommost insulating layer 112.

As shown in the top view of FIG. 8A and the plan view of FIG. 8C, the trenches TR2 laterally extend along the direction Y and are arranged along the direction X. Further, after forming the trenches TR2, the two half portions of each remaining portion of the multilayer stack 110 are laterally spaced apart from each other by one of the trenches TR2. In some embodiments, the trenches TR2 have a width w7 (see, e.g., FIG. 8B) in the range of about 5 nm to about 20 nm along the direction X. That is to say, the two half portions of each remaining portion of the multilayer stack 110 are laterally spaced apart from each other by the separation distance equal to the width w7 of the corresponding trench TR2. In addition, as shown in FIG. 8B, the trenches TR2 expose the remainder of the sacrificial layers 114 in each half of the remaining portions of the multilayer stack 110.

In some embodiments, the method for forming the trenches TR2 includes a lithography process and an etching process (e.g., an anisotropic etching process). Since the substrate 100 has sufficient etching selectivity with respect to the materials in the multilayer stack 110, the substrate 100 may remain substantially intact during the etching process. In some embodiments where the substrate 100 is formed of silicon carbide, the insulating layers 112 are formed of silicon oxide, and the sacrificial layers 114 are formed of silicon nitride, the trenches TR2 are formed by a dry etch using a fluorine-based gas (e.g., $C_4F_6$) mixed with hydrogen (e.g., H$_2$) or oxygen (e.g., O$_2$) gas. In some embodiments, the etching process for forming the trenches TR2 may be similar to the etching process used to form the trenches TR1 described with respect to FIG. 2A and FIG. 2B.

Figure 9A:
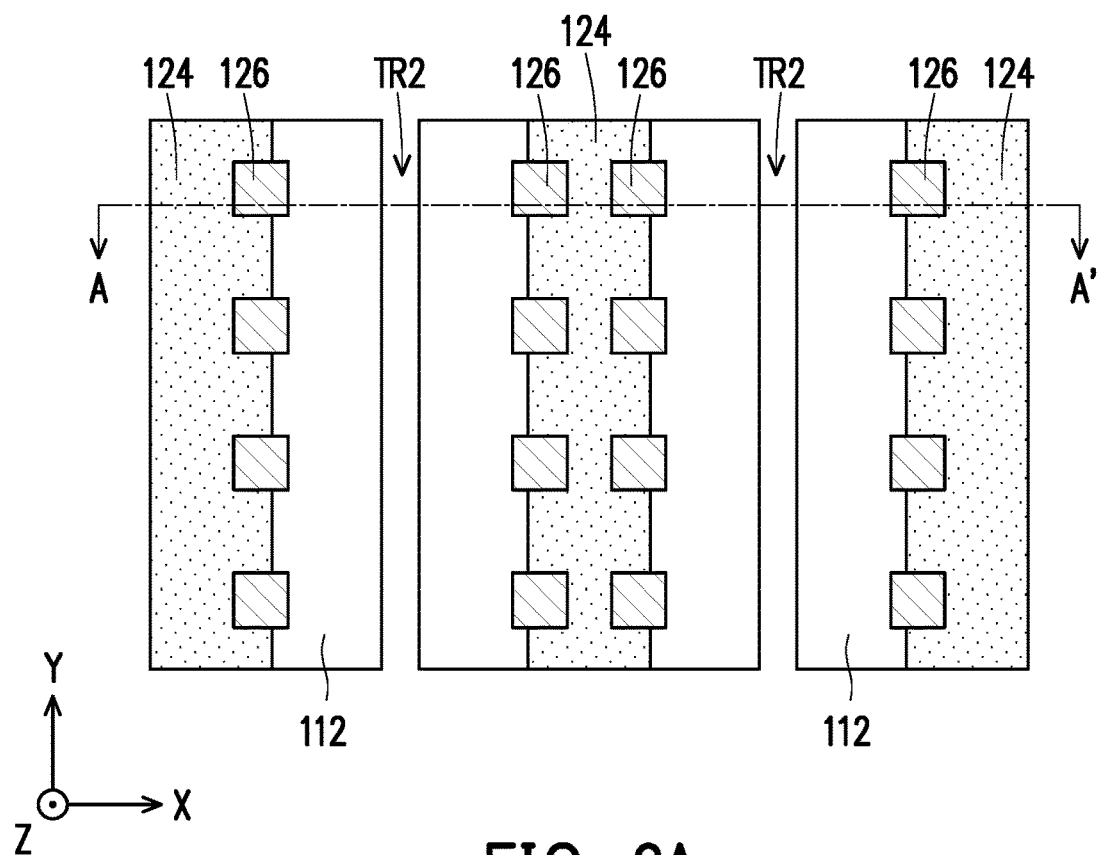
Figure 9B:
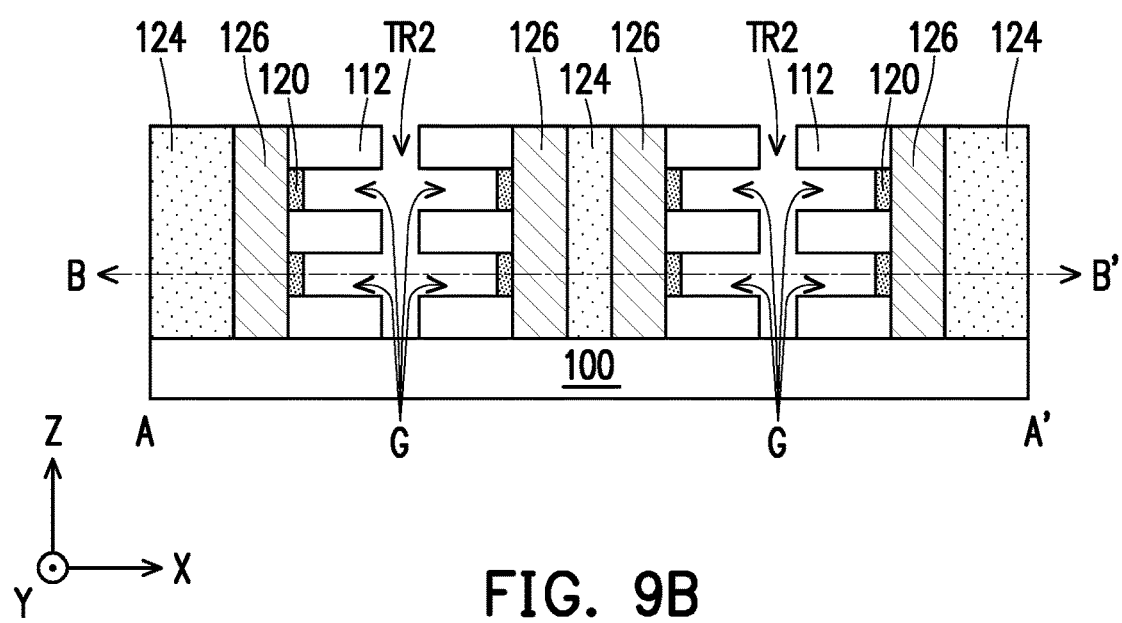
Figure 9C:
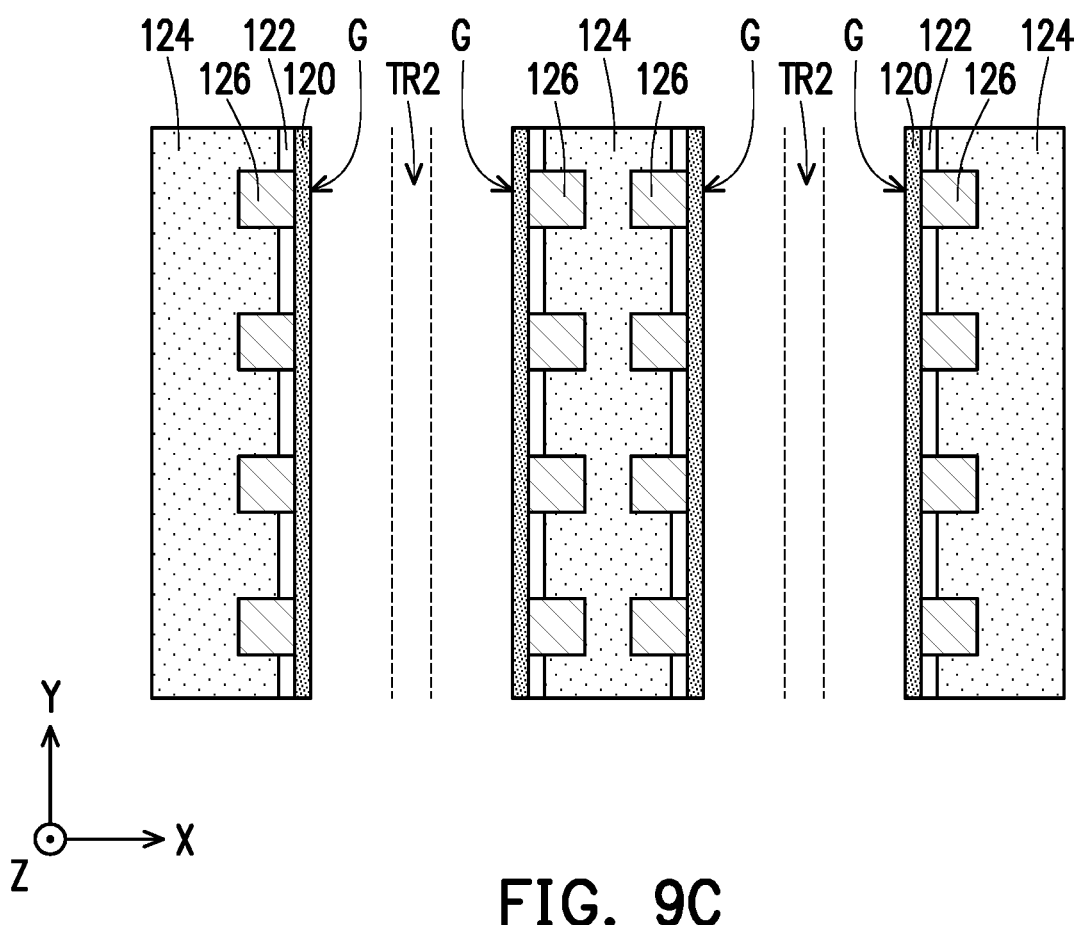

Referring to FIG. 9A, FIG. 9B, and FIG. 9C, the remainder of the sacrificial layers 114 are selectively removed to form gaps G between the insulating layers 112. By removing the remainder of the sacrificial layers 114 via the trenches TR2, the surfaces of the insulating layers 112 and the ferroelectric layers 120 previously in contact with the sacrificial layers 114 are currently exposed by the gaps G. In addition, since the ferroelectric layers 120, the dielectric walls 124, and the conductive pillars 126 are connected to the insulating layers 112, the ferroelectric layers 120, the dielectric walls 124, and the conductive pillars 126 can provide support for the insulating layers 112 and prevent the insulating layers 112 from collapse after removal of the remainder of the sacrificial layers 114. In some embodiments, the method for removing the remainder of the sacrificial layers 114 includes an isotropic etching process. Since the substrate 100, the insulating layers 112, and the ferroelectric layers 120 may have sufficient etching selectivity with respect to the sacrificial layers 114, the sacrificial layers 114 can be selectively removed during such isotropic etching process.

Figure 10A:
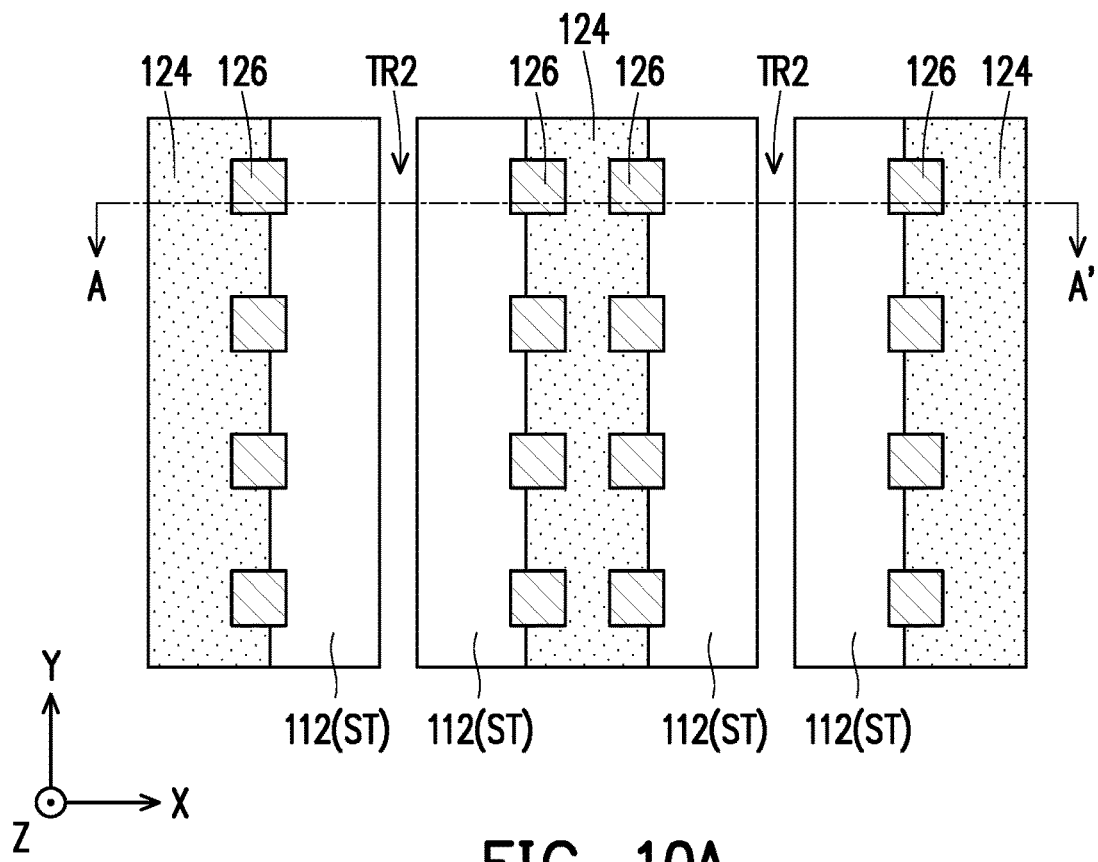
Figure 10B:
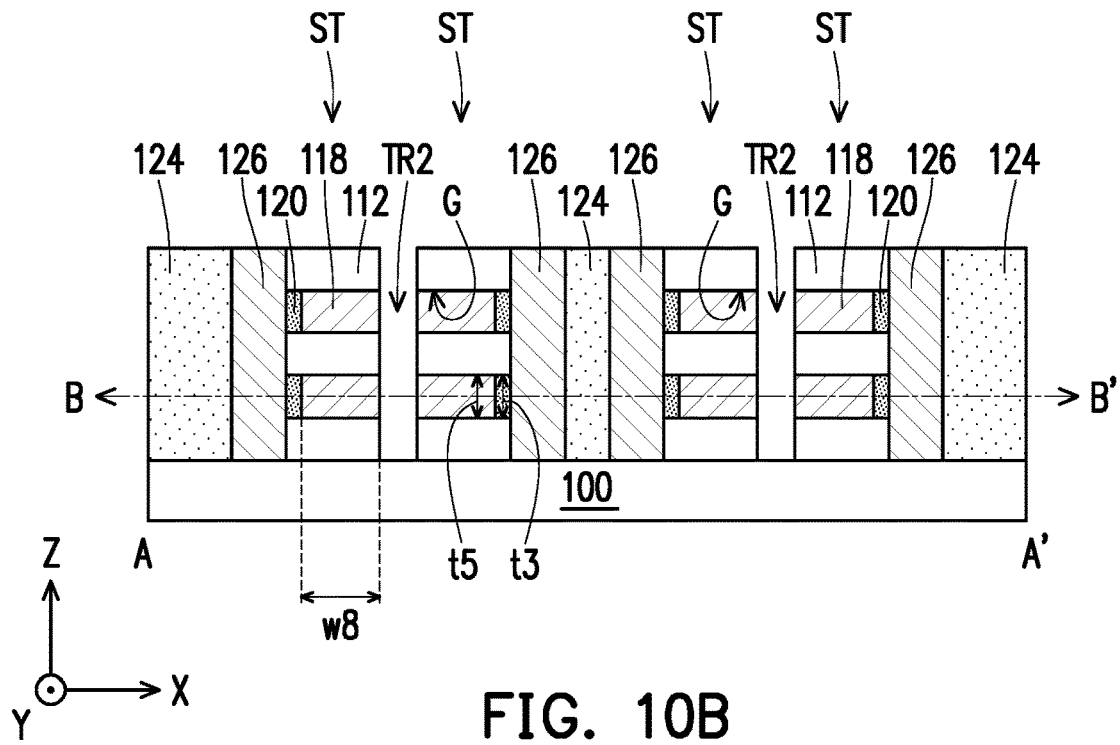
Figure 10C:
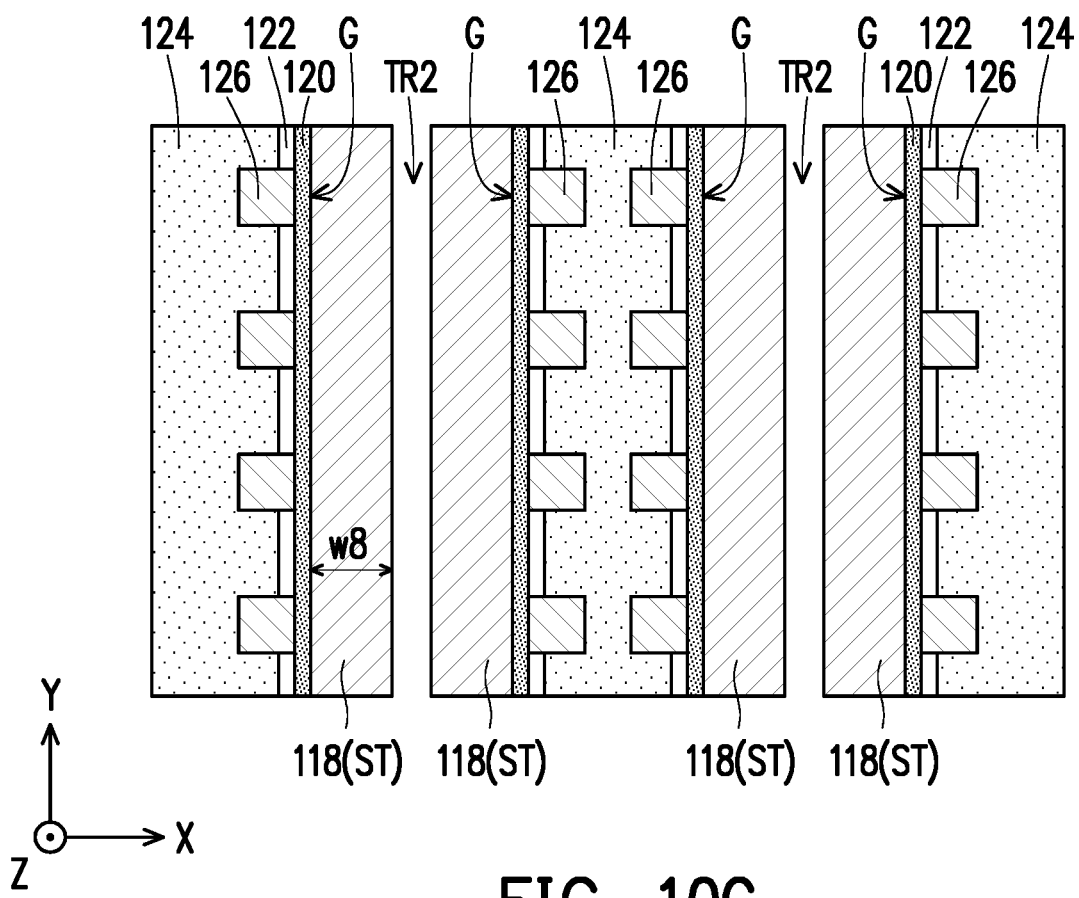

Referring to FIG. 10A, FIG. 10B, and FIG. 10C, gate layers 118 are formed into the gaps G previously occupied by the sacrificial layers 114. In other words, the previously existing sacrificial layers 114 in each half of the remaining portions of the multilayer stack 110 are replaced by the gate layers 118. After forming the gate layers 118, stacking structures ST each including the insulating layers 112 and the gate layers 118 alternately stacked on the substrate 100 are formed. That is to say, after performing the replacement process on the remaining portions of the multilayer stack 110 as described with respect to FIG. 8A to FIG. 10A, FIG. 8B to FIG. 10B, and FIG. 8C to FIG. 10C, the remaining portions of the multilayer stack 110 turn into the stacking structures ST. In detail, as shown in FIG. 8B and FIG. 10B, after performing the replacement process, each remaining portion of the multilayer stack 110 turns into two stacking structures ST. Since the sacrificial layer 114, the corresponding ferroelectric layers 120, and the corresponding channel layers 122 are at substantially the same level in each remaining portion of the multilayer stack 110 as described with reference to FIG. 4A, FIG. 4B, and FIG. 4C, the gate layer 118 taking the place of the sacrificial layer 114 in the stacking structure ST is at substantially the same level with the corresponding ferroelectric layers 120 and the corresponding channel layers 122.

In some embodiments, the stacking structures ST are laterally spaced apart from one another. In detail, as shown in FIG. 10A, FIG. 10B, and FIG. 10C, two adjacent stacking structures ST at opposite sides of one of the trenches TR2 are laterally spaced apart from each other by the one of the trenches TR2. In some embodiments, the two adjacent stacking structures ST at opposite sides of one of the trenches TR2 are laterally spaced apart from each other by the separation distance equal to the width w7 of the trench TR2 described with respect to FIG. 8A, FIG. 8B, and FIG. 8C. Further, as shown in FIG. 10A, FIG. 10B, and FIG. 10C, two adjacent stacking structures ST at opposite sides of one of the dielectric walls 124 are laterally spaced apart from each other by the one of the dielectric walls 124, the corresponding ferroelectric layers 120, the corresponding channel layers 122, and the corresponding conductive pillars 126. As shown in the top view of FIG. 10A and the plan view of FIG. 10C, the stacking structures ST laterally extend along the direction Y and are arranged along the direction X. In some embodiments, the gate layers 118 have a thickness t5 (see, e.g., FIG. 10B) substantially the same as the thickness t3 of the ferroelectric layers 120 along the direction Z. In some embodiments, the thickness t5 of the gate layers 118 is in the range of about 15 nm to about 90 nm. In some embodiments, along the direction X, the gate layers 118 have a width w8 (see, e.g., FIG. 10C) in the range of about 10 nm to about 50 nm.

In some embodiments, each of the gate layers 118 is formed within one of the gaps G in a one-to-one relationship. As shown in FIG. 10B and FIG. 10C, the gate layer 118 is formed to cover or contact the side surface of the ferroelectric layer 120 exposed by the corresponding gap G. In some embodiments, the side surfaces of the gate layers 118 exposed by the trenches TR2 are substantially coplanar or level with the side surfaces of the adjacent insulating layers 112 exposed by the trenches TR2, as shown in FIG. 10B. However, the disclosure is not limited thereto. In some alternative embodiments, the side surface of each gate layer 118 exposed by the corresponding trench TR2 is slightly recessed from the side surfaces of the adjacent insulating layers 112 exposed by the corresponding trench TR2 by a non-zero distance. The non-zero distance ranges from about 1 nm to about 5 nm, for example.

In some embodiments, the gate layers 118 are formed by the following steps. First, a gate material is formed over the substrate 100 to fill up the trenches TR2 and the gaps G between the insulating layers 112. In some embodiments, the gate material not only fills the gaps G and the trenches TR2, but also further covers the top surfaces of the topmost insulating layers 112 in the stacking structures ST, the top surfaces of the conductive pillars 126, and the top surfaces of the dielectric walls 124. In some embodiments, the method for forming the gate material includes a deposition process, such as a CVD process or an ALD process. The gate material may include copper, tungsten, cobalt, aluminum, tungsten nitride, rhuthenium, silver, gold, rhodium, molybdenum, nickel, cadmium, zinc, alloys thereof, combinations thereof, or the like. Thereafter, the portions of the gate material not covered by the insulating layers 112 in the stacking structures ST are removed by an etching process, such as an anisotropic etching process. The remaining portions of the conductive material form the gate layers 118. In other words, the insulating layers 112 in the stacking structures ST may function as shadow masks during the etching process and the patterning of the conductive material can be considered as a self-aligned process. In some alternative embodiments, barrier layers may be formed between the gate layers 118 and the adjacent insulating layers 112, so as to prevent the metal elements of the gate layers 118 from diffusing to the adjacent insulating layers 112. The barrier layers may also provide the function of increasing the adhesion between the gate layers 118 and the adjacent insulating layers 112 and may be referred to as glue layers in some examples. The barrier layers may include a metal nitride, such as titanium nitride, tantalum nitride, molybdenum nitride, zirconium nitride, or hafnium nitride. In some other embodiments, the barrier layers and the gate layers 118 have different conductive materials. For example, the gate layers 118 are made of tungsten, and the barrier layers are made of titanium nitride.

Figure 11A:
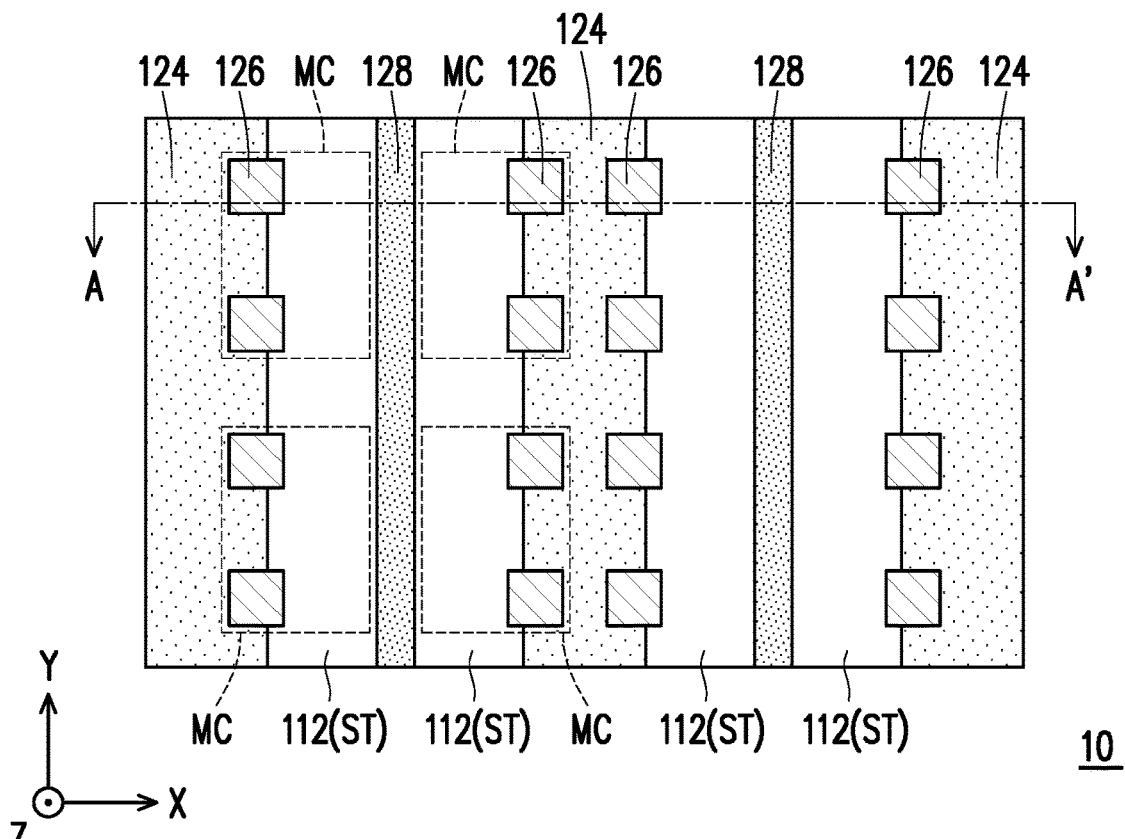
Figure 11B:
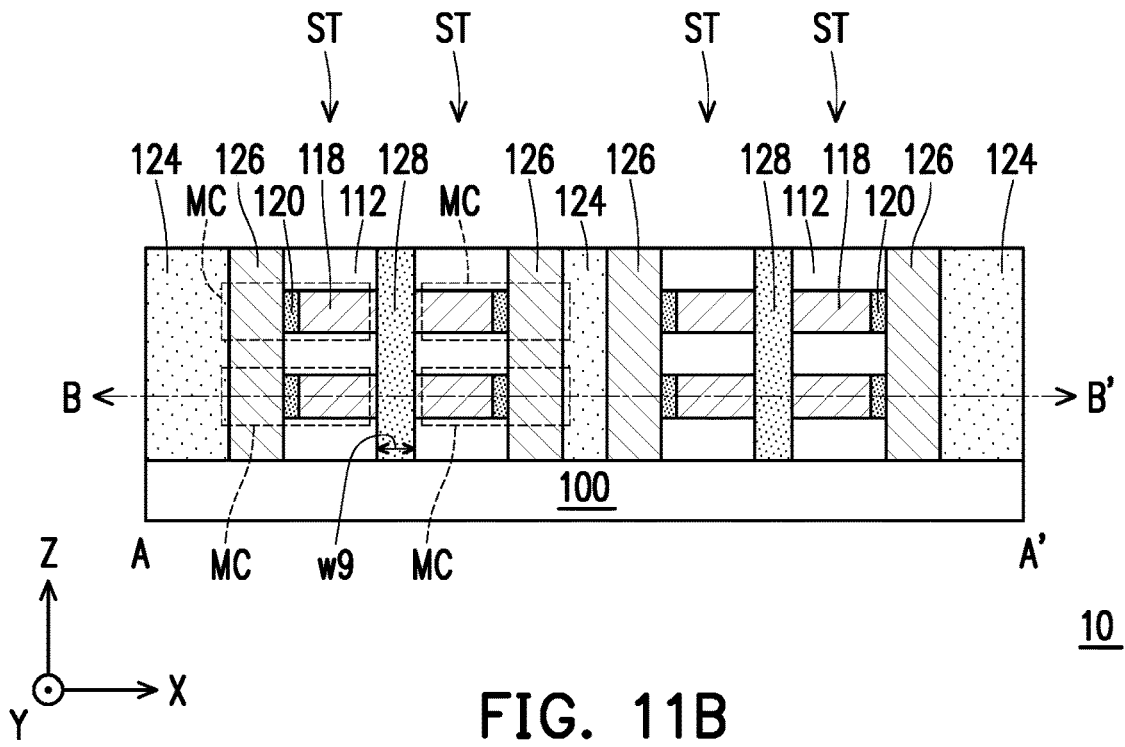
Figure 11C:
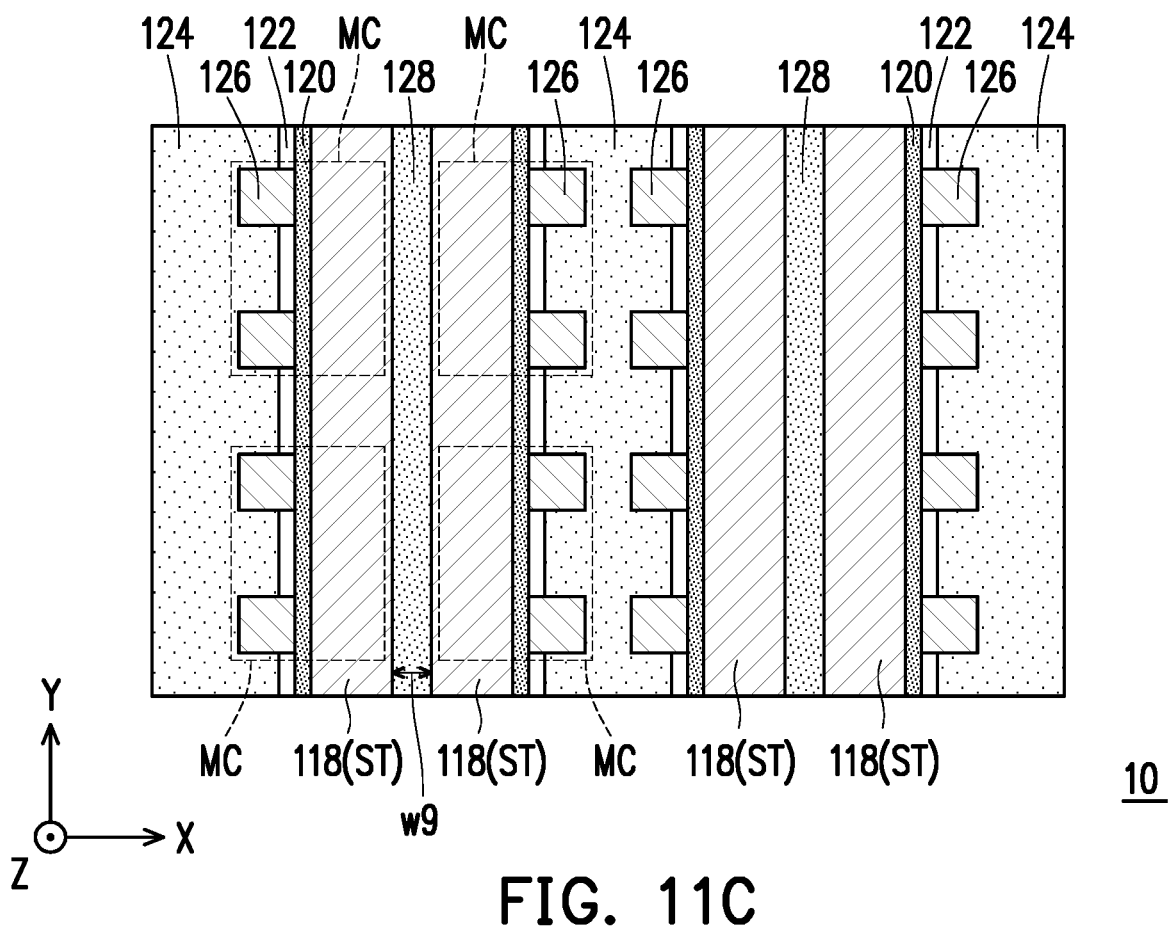

Referring to FIG. 11A, FIG. 11B, and FIG. 11C, dielectric walls 128 are formed to fill up the trenches TR2. As shown in FIG. 11A, FIG. 11B, and FIG. 11C, the dielectric walls 128 are in contact with the side surfaces of the insulating layers 112 exposed by the trenches TR2 and the side surfaces of the gate layers 118 exposed by the trenches TR2. In embodiments where the side surface of each gate layer 118 exposed by the corresponding trench TR2 is substantially coplanar or level with the side surfaces of the adjacent insulating layers 112 exposed by the corresponding trench TR2, the side surface of the dielectric wall 128 in contact with the side surfaces of the insulating layers 112 and the side surface of the gate layer 118 exposed by the corresponding trench TR1 has a substantially smooth profile. In some embodiments, as shown in FIG. 11A, FIG. 11B, and FIG. 11C, the side surface of the dielectric wall 128 in contact with the side surfaces of the insulating layers 112 and the side surface of the gate layer 118 exposed by the corresponding trench TR2 is substantially straight. However, the disclosure is not limited thereto. In embodiments where the side surface of each gate layer 118 exposed by the corresponding trench TR2 is slightly recessed from the side surfaces of the adjacent insulating layers 112 exposed by the corresponding trench TR2, the side surface of the dielectric wall 128 in contact with the side surfaces of the insulating layers 112 and the side surface of the gate layers 118 exposed by the corresponding trench TR2 has an uneven profile. In such case, the dielectric walls 128 may have laterally protruding portions in contact with the side surfaces of the corresponding gate layers 118. In some embodiments, as shown in FIG. 11B, the bottom surfaces of the dielectric walls 128 are in contact with the top surface portion of the substrate 100 exposed by the trenches TR2. However, the disclosure is not limited thereto. In some alternative embodiments, the bottom surfaces of the dielectric walls 128 are not in contact with the top surface portion of the substrate 100 exposed by the trenches TR2. For example, the bottom surfaces of the dielectric walls 128 may in contact with the bottommost insulating layer 112.

In some embodiments, the dielectric walls 128 are formed by the following steps. A dielectric material is formed to fill the trenches TR2. The dielectric material may include silicon nitride, silicon oxide, silicon oxynitride, phosphosilicate glass (PSG), borosilicate glass (BSG), boron-doped phosphosilicate glass (BPSG), or the like, or a combination thereof, and may be formed by a suitable deposition process, such as a CVD process or an ALD process. After the dielectric material is formed, a planarization process, such as a chemical mechanical planarization (CMP) process, an etching process, or a combination thereof, may be performed to remove portions of the dielectric material outside the trenches TR2. In some embodiments, the portions of the dielectric material removed by the planarization process are over the top surfaces of the topmost insulating layers 112 in the stacking structures ST. That is to say, the planarization process exposes the stacking structures ST, such that the top surfaces of the stacking structures ST (e.g., the top surfaces of the topmost insulating layers 112) and the top surfaces of the remaining portions of the dielectric material are substantially coplanar or level with one another after the planarization process is complete. The remaining portions of the dielectric material in the trenches TR2 form the dielectric walls 128.

As shown in the plan view of FIG. 11C, the dielectric walls 128 laterally extend along the direction Y. In addition, as shown in the plan view of FIG. 11C, each of the dielectric walls 128 is disposed between two adjacent stacking structures ST. That is to say, two adjacent stacking structures ST at opposite sides of one of the dielectric walls 128 are laterally separated from each other by the one of the dielectric walls 128. In some embodiments, along the direction X, the dielectric walls 128 have a width w9 (see, e.g., FIG. 11B) substantially the same as the width w7 of the trench TR2 (see, e.g., FIG. 8B) described with respect to FIG. 8A to FIG. 8C. In some embodiments, the width w9 of the dielectric walls 128 is in the range of about 5 nm to about 20 nm.

Up to here, the three-dimensional memory device 10 according to some embodiments of the present disclosure has been formed. Referring to FIG. 11A, FIG. 11B, and FIG. 11C, the three-dimensional memory device 10 includes the stacking structures ST laterally spaced apart from one another, wherein each of the stacking structures ST includes the insulating layers 112 and the gate layers 118 alternately stacked on the substrate 100. In detail, the stacking structures ST are laterally spaced apart from one another by dielectric walls (e.g., the dielectric walls 124 and the dielectric walls 128). Further, the three-dimensional memory device 10 also includes the ferroelectric layers 120 between two adjacent insulating layers 112 in each of the stacking structures ST, the channel layers 122 between two adjacent insulating layers 112 in each of the stacking structures ST, and the conductive pillars 126 vertically penetrate through the dielectric walls 124, laterally separated from one another and in contact with the channel layers 122 in each of the stacking structures ST. As shown in FIG. 11B and FIG. 11C, one of the gate layers 118 in each stacking structure ST is at substantially the same level with one of the ferroelectric layers 120 and one of the channel layers 122. That is to say, in each stacking structure ST, one gate layer 118, one ferroelectric layer 120, and one channel layer 122 are together sandwiched between the same underlying insulating layer 112 and the same overlying insulating layer 112. As such, the gate layer 118, the ferroelectric layer 120, and the channel layer 122 at substantially the same level can be collectively referred to as a stacking layer of the stacking structure ST. In view of this, the stacking structure ST can be regarded as including stacking layers (each including one gate layer 118, one ferroelectric layer 120 and one channel layer 122) and insulating layers 112 alternately stacked on the substrate 100.

As shown in FIG. 11C, in each of the stacking structures ST, a portion of the gate layer 118, portions of the ferroelectric layer 120 and the channel layer 122 that are in the same stacking layer as the gate layer 118 and that are laterally adjacent to the portion of the gate layer 118, and portions of the two adjacent conductive pillars 126 laterally adjacent to the portion of the gate layer 118 constitute a field effect transistor (FET), which is functioned as a memory cell MC. That is to say, the memory cell MC can be regarded as including a pair of the conductive pillars 126, one channel layer 122, one ferroelectric layer 120, and one gate layer 118. In one memory cell MC, one of the pair of the conductive pillars 126 is functioned as a source terminal of the memory cell MC and another one of the pair of the conductive pillars 126 is functioned as a drain terminal of the memory cell MC. Dipole moments in opposite directions can be stored in the ferroelectric layer 120. Accordingly, the FET has different threshold voltages corresponding to the dipole moments. Thus, the FET can be identified as having different logic states. In these embodiments, the memory cell MC is a ferroelectric FET.

Further, as shown in FIG. 11B and FIG. 11C, the stacking layers (each including one gate layer 118, one ferroelectric layer 120, and one channel layer 122) stacked along the direction Z (e.g., the vertical direction) in each stacking structure ST, as well as portions of pairs of conductive pillars 126 aside the stacking layers, form a stack of memory cells MC. In addition, as shown in FIG. 11A, FIG. 11B, and FIG.

11C, multiple stacks of the memory cells MC are arranged along the direction X (e.g., the horizontal direction) and the direction Y (e.g., the horizontal direction). That is to say, the multiple stacks of the memory cells MC are separately arranged in an array of rows and columns. In detail, the multiple stacks of the memory cells MC are separately arranged as having multiple columns extending along the direction Y and multiple rows extending along the direction X.

As shown in FIG. 11B and FIG. 11C, each of the channel layers 122 is shared by the corresponding column of memory cells MC along the direction Y, and thus conductive channels of these memory cells MC are formed in different sections of the channel layer 122. In addition, as shown in FIG. 11B and FIG. 11C, laterally adjacent memory cells MC at opposite sides of one of the dielectric walls 128 are separated from each other by the one of the dielectric walls 128. That is to say, the gate layers 118 of the laterally adjacent memory cells MC at opposite sides of one of the dielectric walls 128 are physically and electrically separate from each other. In other words, the laterally adjacent memory cells MC at opposite sides of one of the dielectric walls 128 include two separate, independent gate layers 118. Consequently, in the three-dimensional memory device 10, the disturbance between the laterally adjacent memory cells at opposite sides of one of the dielectric walls 128 can be effectively prevented. Further, as shown in FIG. 11B and FIG. 11C, laterally adjacent memory cells MC at opposite sides of one of the dielectric walls 124 are separated from each other by the one of the dielectric walls 124. That is to say, the pairs of conductive pillars 126 in the laterally adjacent memory cells MC at opposite sides of one of the dielectric walls 124 are physically and electrically separate from each other. In other words, the laterally adjacent memory cells MC at opposite sides of one of the dielectric walls 124 respectively have their own pairs of source and drain terminals. Consequently, in the three-dimensional memory device 10, the disturbance between the laterally adjacent memory cells at opposite sides of one of the dielectric walls 124 can be effectively prevented.

In addition, although not shown, the three-dimensional memory device 10 further includes bit lines and source lines electrically connected to the conductive pillars 126. The pair of conductive pillars 126 in each stack of memory cells MC are connected to one of the bit lines and one of the source lines, respectively. In some embodiments, the bit lines and the source lines extend along the direction X. In some embodiments, the conductive pillars 126 in adjacent stacks of memory cells MC may be connected to different bit lines and different source lines. Accordingly, the memory cells MC in adjacent stacks of memory cells MC can be controlled by different bit lines and different source lines, whereby disturbance between the memory cells MC in adjacent stacks of memory cells MC can be reduced. In embodiments where the conductive pillars 126 in adjacent stacks of memory cells MC are connected to different bit lines and different source lines, the bit lines and the source lines are disposed at opposite sides of the substrate 100. For example, the source lines extend below the substrate 100, while the bit lines extend above the stacking structures ST. As another example, the source lines extend above the stacking structures ST, while the bit lines extend below the substrate 100. However, the disclosure is not limited thereto. In some alternative embodiments, the bit lines and the source lines may be disposed at the same side of the substrate 100. In such a case, the bit lines and the source lines are alternately arranged along the direction Y, wherein each of the bit lines is electrically connected to the conductive pillars 126 in the same row, and each of the source lines is electrically connected to the conductive pillars 126 in the same row, and each of the bit lines and each of the source lines are perpendicular to the stacking structures ST.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 12:
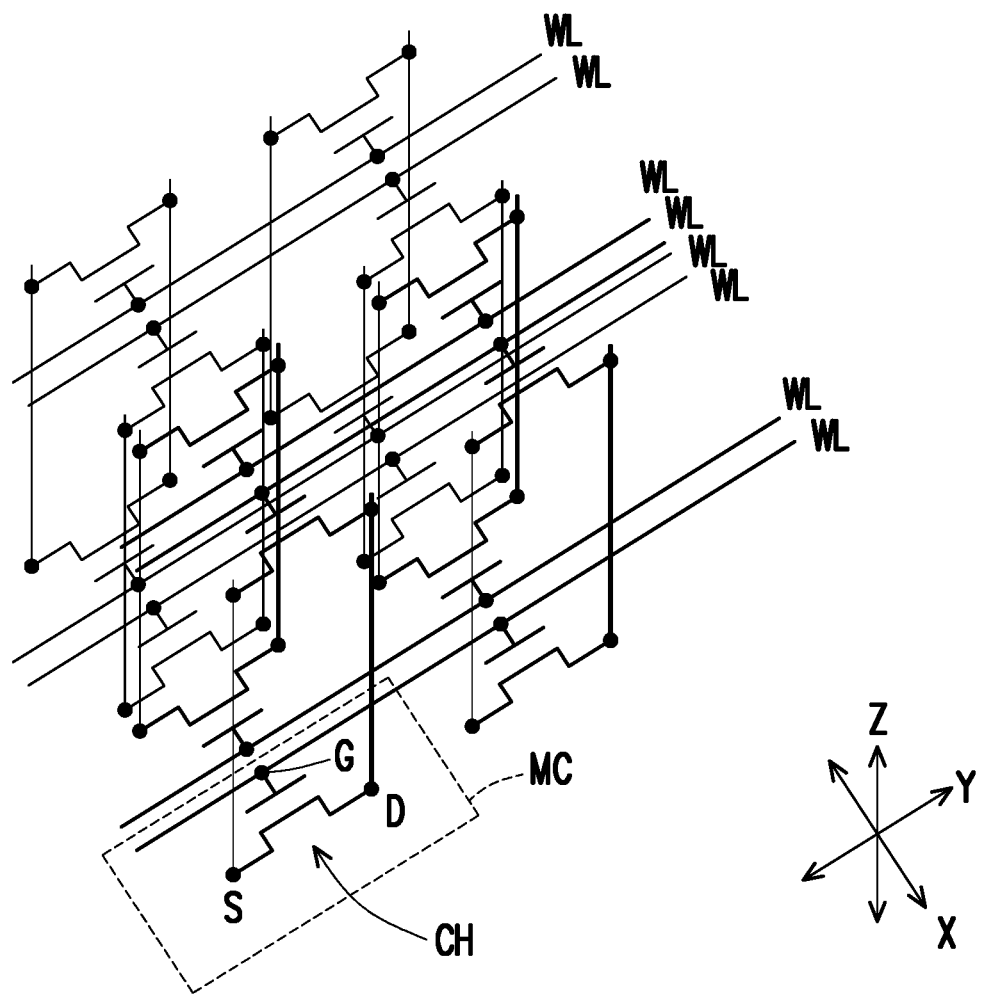
FIG. 12 is an equivalent circuit diagram of the three-dimensional memory device shown in FIG. 11A, FIG. 11B, and FIG. 11C.

FIG. 12 is an equivalent circuit diagram of the three-dimensional memory device shown in FIG. 11A, FIG. 11B and FIG. 11C.

Referring to FIG. 11B, FIG. 11C, and FIG. 12, the gate layers 118 in each stacking structure ST shown in FIG. 11B and FIG. 11C function as word lines WL as shown in FIG. 12. Each word line WL connects gate terminals G of the corresponding column of memory cells MC along the direction Y. In addition, each pair of conductive pillars 126 in one of the memory cells MC shown in FIG. 11B and FIG. 11C separately connect to source and drain terminals S, D of the memory cells MC stacked along the direction Z as shown in FIG. 12. As shown in FIG. 12, the gate terminals G of each stack of the memory cells MC are respectively connected to one of the word lines WL. Further, as shown in FIG. 12, the gate terminals G of the adjacent stacks of the memory cells MC are respectively connected to different word lines WL. In addition, the source terminals S of each stack of the memory cells MC are connected together by one of the corresponding pair of the conductive pillars 126, and the drain terminals D of each stack of the memory cells MC are connected together by another one of the corresponding pair of the conductive pillars 126. In other words, channels CH between the source and drain terminals S, D of each stack of the memory cells MC are connected in parallel. Accordingly, each stack of the memory cells MC may be regarded as being connected by a NOR-flash configuration, and the three-dimensional memory device 10 may be referred as a three-dimensional NOR memory device.

Figure 13:
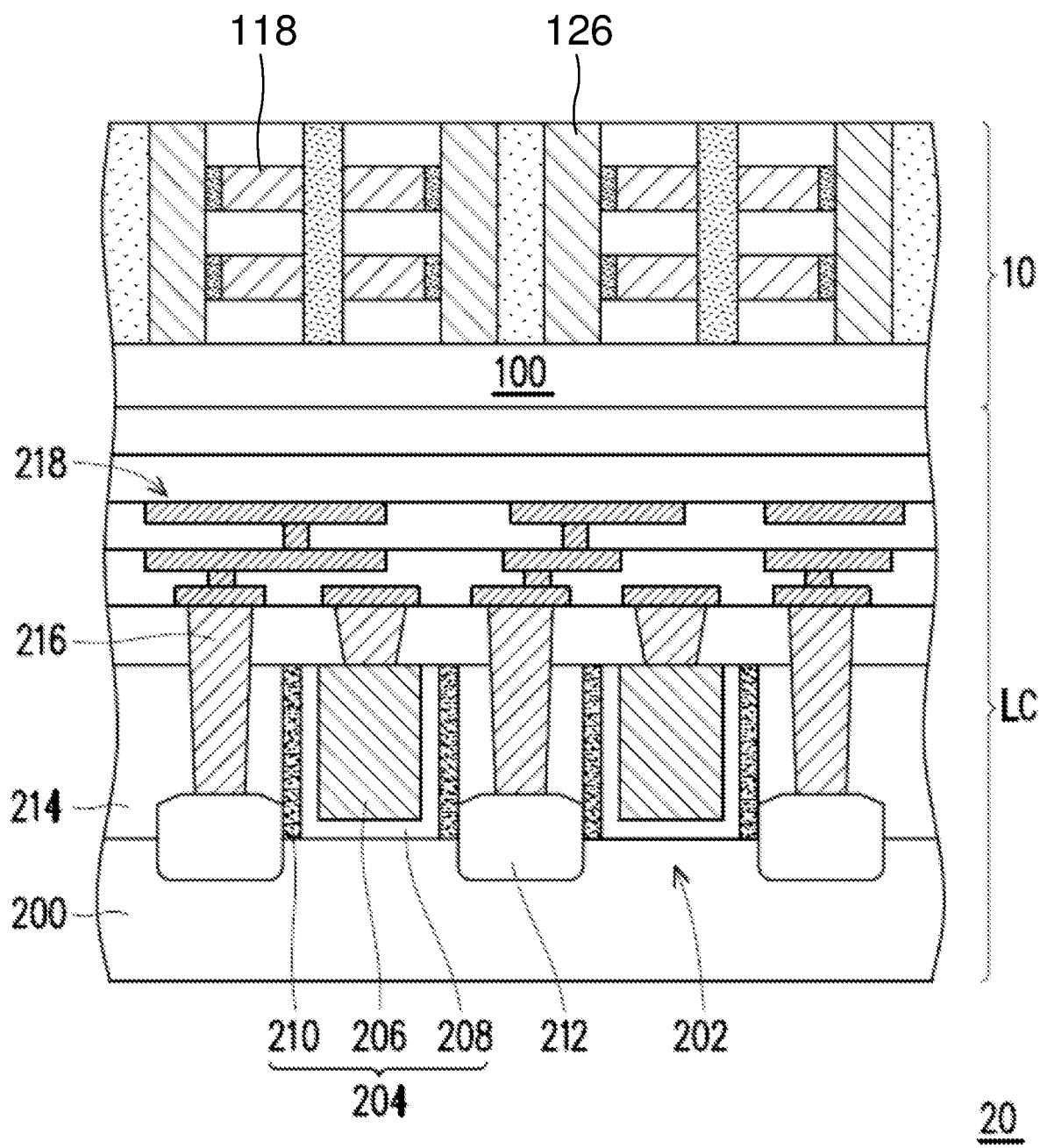
FIG. 13 is a schematic cross-sectional view illustrating a semiconductor structure in accordance with some embodiments of the disclosure.

FIG. 13 is a schematic cross-sectional view illustrating a semiconductor structure 20 in accordance with some embodiments of the disclosure.

Referring to FIGS. 11A-11C and FIG. 13, the semiconductor structure 20 shown in FIG. 13 includes the three-dimensional memory device 10 as described with reference to FIGS. 11A-11C. In those embodiments where the substrate 100 of the three-dimensional memory device 10 is an etching stop layer, a CMOS integrated circuit LC may lie under the substrate 100, and the CMOS integrated circuit LC may also be referred as a CMOS-under-array (CUA). Although not shown, the gate layers 118 and the conductive pillars 126 may be routed to the CMOS integrated circuit LC, and the three-dimensional memory device 10 may be controlled by the CMOS integrated circuit LC.

In some embodiments, the CMOS integrated circuit LC is built on a semiconductor substrate 200. The semiconductor substrate 200 may be a semiconductor wafer or a semiconductor-on-insulator (SOI) wafer. The CMOS integrated circuit LC may include active devices formed on a surface region of the semiconductor substrate 200. In some embodiments, the active devices include metal-oxide-semiconductor (MOS) transistors 202. The MOS transistors 202 may respectively include a gate structure 204 formed over the semiconductor substrate 200. In some embodiments, the gate structure 204 includes a gate electrode 206, a gate dielectric layer 208, and a gate spacer 210. The gate dielectric layer 208 may spread between the gate electrode 206 and the semiconductor substrate 200, and may or may not further cover a sidewall of the gate electrode 206. The gate spacer 210 may laterally surround the gate electrode 206 and the gate dielectric layer 208. Further, the MOS transistor 202 may further include source/drain regions 212. The source/drain regions 212 may be formed in the semiconductor substrate 200, and are located at opposite sides of the gate structure 204. In some embodiments, the source/drain regions 212 may be epitaxial structures, and may protrude from a surface of the semiconductor substrate 200. It should be noted that, although the MOS transistors 202 are depicted as planar-type MOS transistors that forms conductive channels (not shown) along the surface of the semiconductor substrate 200, the MOS transistors 202 may alternatively be fin-type MOS transistors (or referred as finFET), gate-all-around (GAA) FETs, or the like.

In some embodiments, the CMOS integrated circuit LC further includes dielectric layers 214 stacked on the semiconductor substrate 200 and includes contact plugs 216 and interconnections 218 formed in the stack of dielectric layers 214. A bottommost dielectric layer 214 may laterally surround the gate structures 204 and cover the source/drain regions 212. Some of the contact plugs 216 may penetrate through the bottommost one of the dielectric layers 214, in order to establish electrical connection with the source/drain regions 212, while others of the contact plugs 216 may stand on the gate structures 204 and electrically connect to the gate electrodes 206 of the gate structures 204. The interconnections 218 may spread on the contact plugs 216 and are electrically connected to the contact plugs 216. The interconnections 218 may include conductive traces and conductive vias. The conductive traces respectively lie on one of the dielectric layers 214, whereas the conductive vias respectively penetrate through one or more of the dielectric layers 214 and electrically connect to one or more of the conductive traces.

In some embodiments, the three-dimensional memory device 10 is disposed on the stack of dielectric layers 214. In these embodiments, the gate layers 118 and the conductive pillars 126 of the three-dimensional memory device 10 may be routed to the interconnections 218 in the stack of dielectric layers 214 by conductive paths (not shown) extending through the substrate 100 and the topmost one of the dielectric layers 214. For instance, the gate layers 118 (or referred to as word lines) may be routed to word line drivers formed by some of the active devices interconnected by a portion of the interconnections 218, and the conductive pillars 126 may be routed to sense amplifiers formed by others of the active devices interconnected by another portion of the interconnections 218.

Figure 14:
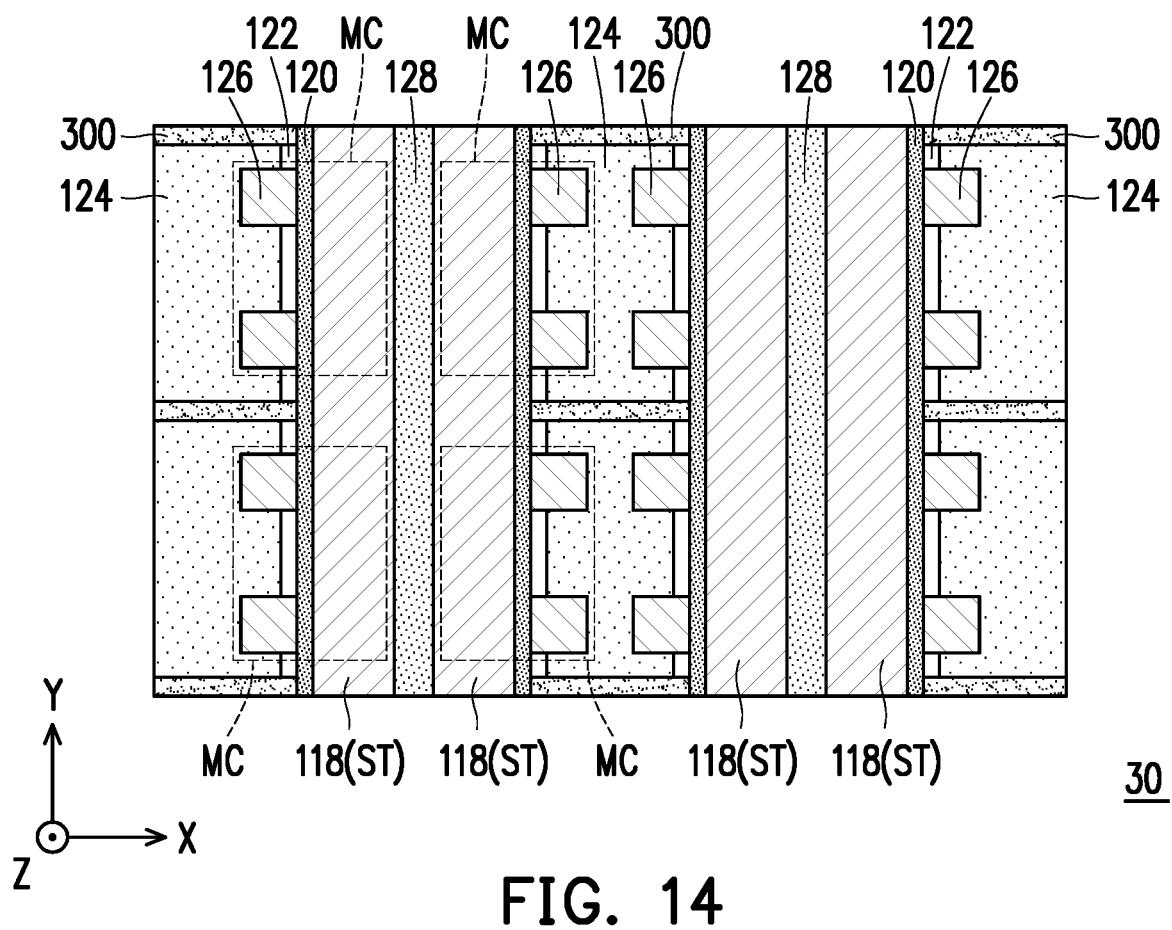
FIG. 14 is a schematic plan view of a three-dimensional memory device in accordance with some alternative embodiments of the present disclosure.

FIG. 14 is a schematic plan view of a three-dimensional memory device 30 in accordance with some alternative embodiments of the present disclosure. The three-dimensional memory device 30 illustrated in FIG. 14 is similar to the three-dimensional memory device 10 illustrated in FIG. 11C. Hence, the same reference numerals are used to refer to the same or like parts, and its detailed description will be omitted herein. The differences between the three-dimensional memory device 30 illustrated in FIG. 14 and the three-dimensional memory device 10 illustrated in FIG. 11C will be described below.

Referring to FIG. 14, the three-dimensional memory device 30 further includes insulators 300 penetrating through the dielectric walls 124, the insulating layers 112 and the channel layers 122 along the direction Z. In detail, each insulator 300 vertically extends through the corresponding dielectric wall 124, the corresponding insulating layers 112, and the corresponding channel layers 122. As shown in FIG. 14, each insulator 300 laterally extends to cut off two adjacent channel layers 122 at opposite sides of the corresponding dielectric wall 124 along the direction X. That is to say, the insulator 300 laterally extends between two adjacent stacking structures ST at opposite sides of the corresponding dielectric wall 124 along the direction X. Further, as shown in FIG. 14, the insulator 300 is formed between the laterally adjacent memory cells MC in the column of memory cells MC along the direction Y. In view of this, the channel layers 122 of the laterally adjacent memory cells MC in each column of memory cells MC along the direction Y are separated from each other by the one of the insulators 300. That is to say, the channel layers 122 of the laterally adjacent memory cells MC in each column of memory cells MC along the direction Y are physically and electrically separate from each other. In other words, the laterally adjacent memory cells MC in each column of memory cells MC along the direction Y include two separate, independent channel layers 122. Consequently, in the three-dimensional memory device 30, the disturbance between the laterally adjacent memory cells in each column of memory cells MC along the direction Y can be effectively prevented. From another point of view, as shown in FIG. 14, the pair of the conductive pillars 126 in each memory cell MC is disposed between two adjacent insulators 300 along the direction Y. Further, since the insulator 300 laterally extends between two adjacent columns of the memory cells MC at opposite sides of the corresponding dielectric wall 124 along the direction X, two pairs of the conductive pillars 126 in two adjacent memory cells MC at opposite sides of one of the dielectric walls 124 are disposed between the same two adjacent insulators 300 along the direction Y. Although nine insulators 300 are presented in FIG. 14 for illustrative purposes, those skilled in the art can understand that the number of the insulators 300 may be more than what is depicted in FIG. 14 and may be designated based on demand and/or design layout.

In the illustrated embodiment, the insulators 300 do not laterally extend through the ferroelectric layers 120 along the direction X. Different sections of the ferroelectric layer 120 may be independently polarized, and thus the ferroelectric layer 120 can function to store values even when adjacent sections of the ferroelectric layer 120 corresponding to the laterally adjacent memory cells MC in each column of memory cells MC along the direction Y are not physically and electrically separated. However, the disclosure is not limited thereto. In some alternative embodiments, each insulator 300 further laterally extends to cut off the ferroelectric layers 120 at opposite sides of the corresponding dielectric wall 124 along the direction X.

In some embodiments, the insulators 300 are laterally separated from one another. As shown in FIG. 14, the insulators 300 are separately arranged as having multiple columns extending along the direction Y, and adjacent columns of the insulators 300 are spaced apart from each other along the direction X. In the illustrated embodiment, the insulators 300 are laterally separated from the conductive pillars 126. However, the disclosure is not limited thereto. In some alternative embodiments, the insulators 300 may contact the conductive pillars 126.

In some embodiments, the method for forming the insulators 300 includes the following steps. First, after the conductive pillars 126 are formed as described with reference to FIG. 7A, FIG. 7B, and FIG. 7C, trenches penetrating through the dielectric walls 124, the insulating layers 112, and the channel layers 122 along the direction Z are formed by using a lithography process and an etching process. A mask pattern, such as patterned photoresist, may be formed over the multilayer stack 110. The etching process may then be performed by using the mask pattern as an etching mask to remove portions of the dielectric walls 124, the insulating layers 112, and the channel layers 122 so as to form the trenches. After the etching process is finished, the mask pattern (e.g., patterned photoresist) may be removed by a suitable removal process, such as ashing or stripping. In some embodiments, the etching process is an anisotropic etching process. Next, a dielectric material is formed to fill the trenches. The dielectric material may include silicon oxide, silicon nitride, silicon oxynitride, tetraethylorthosilicate (TEOS) oxide, un-doped silicate glass, borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, benzocyclobutene (BCB), SiLK™ (Dow Chemical, Midland, Mich.), polyimide, other low-k dielectric material, or combinations thereof. Herein, the low-k dielectric material used in the insulators 300 between adjacent memory cells MC is able to decrease the crosstalk or the coupling interference between the adjacent memory cells MC, thereby increasing the performance and the reliability of the three-dimensional memory device 30. The dielectric material may be formed by a suitable deposition process, such as a CVD process or an ALD process. After the dielectric material is formed, a planarization process, such as a CMP process, an etching process, or a combination thereof, may be performed to remove portions of the dielectric material outside the trenches. In some embodiments, the portions of the dielectric material removed by the planarization process are over the top surface of the topmost insulating layer 112, the top surfaces of the dielectric walls 124, and the top surfaces of the conductive pillars 126. That is to say, the planarization process exposes the multilayer stack 110, the dielectric walls 124, and the conductive pillars 126, such that the top surface of the multilayer stack 110 (e.g., the top surface of the topmost insulating layer 112), the top surfaces of the dielectric walls 124, the top surfaces of the conductive pillars 126, and the top surfaces of the remaining portions of the dielectric material are substantially coplanar or level with one another after the planarization process is complete. The remaining portions of the dielectric material in the trenches form the insulators 300. However, the disclosure is not limited thereto. In some alternative embodiments, the step for forming the insulators 300 may precede the step for forming the conductive pillars 126.

Figure 15:
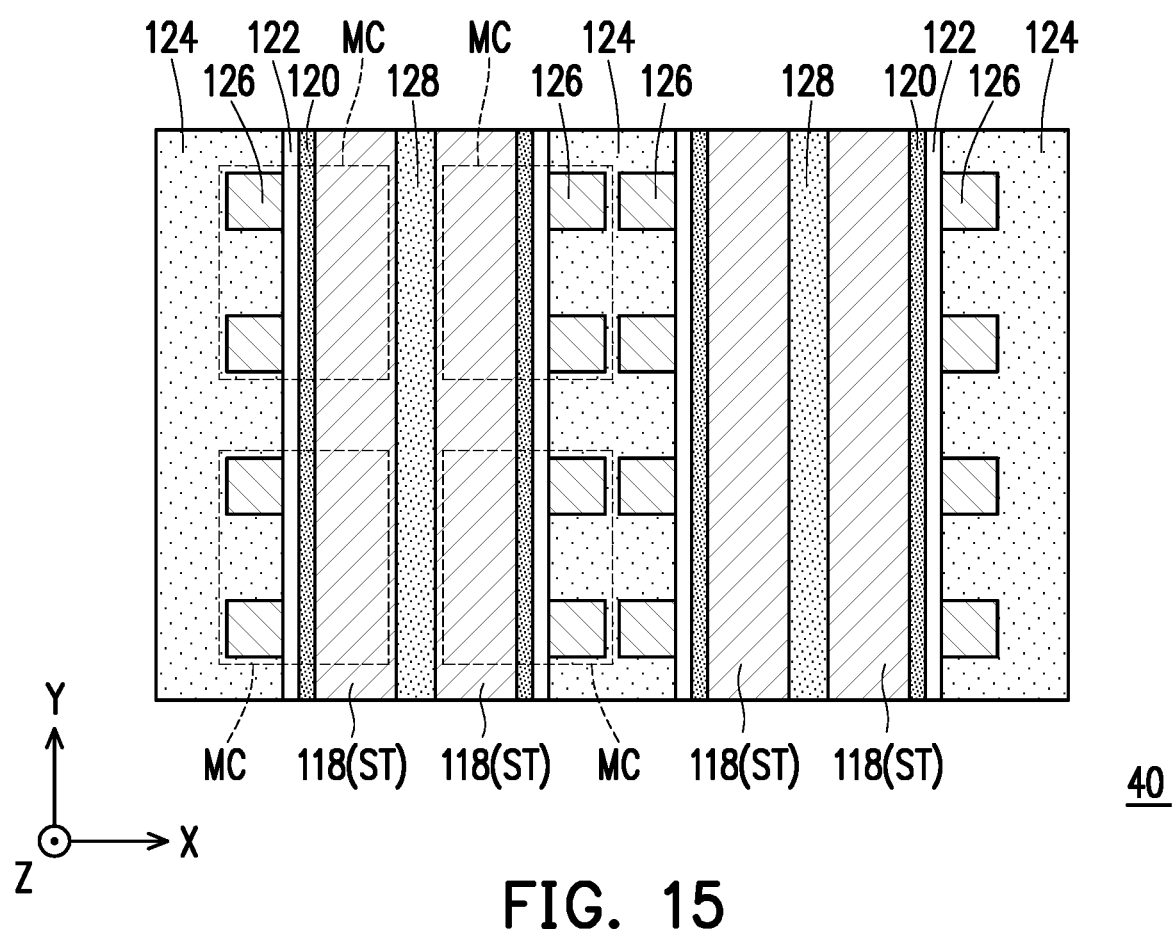
FIG. 15 is a schematic plan view of a three-dimensional memory device in accordance with some alternative embodiments of the present disclosure.

FIG. 15 is a schematic plan view of a three-dimensional memory device in accordance with some alternative embodiments of the present disclosure. The three-dimensional memory device 40 illustrated in FIG. 15 is similar to the three-dimensional memory device 10 illustrated in FIG. 11C. Hence, the same reference numerals are used to refer to the same or liked parts and its detailed description will be omitted herein. The differences between the three-dimensional memory device 40 illustrated in FIG. 15 and the three-dimensional memory device 10 illustrated in FIG. 11C will be described below.

Referring to FIG. 15, in the three-dimensional memory device 40, the conductive pillars 126 penetrate through the dielectric walls 124 along the direction Z without penetrating through the channel layers 122. That is to say, in each memory cell MC, the conductive pillars 126 are laterally separated from the corresponding ferroelectric layer 120 by the corresponding channel layers 122. From another point of view, as shown in FIG. 15, each conductive pillar 126 is formed to be in lateral contact with one of the corresponding channel layers 122 through one side surface. In addition, as shown in FIG. 15, the conductive pillars 126 arranged in the same dielectric wall 124 are laterally separated from one another by the dielectric wall 124. Further, although not shown, the three-dimensional memory device 40 may further include insulators between the laterally adjacent memory cells MC along the direction Y as described with reference to FIG. 14.

In the aforesaid embodiments with respect to FIGS. 1-15, the conductive pillars 126 in the same row of the array are all aligned with one another. However, the disclosure is not limited thereto. In some alternative embodiments, the conductive pillars 126 may be arranged in a staggered configuration. Hereinafter, other configurations of the three-dimensional memory device will be discussed in conjunction with FIG. 16.

Figure 16:
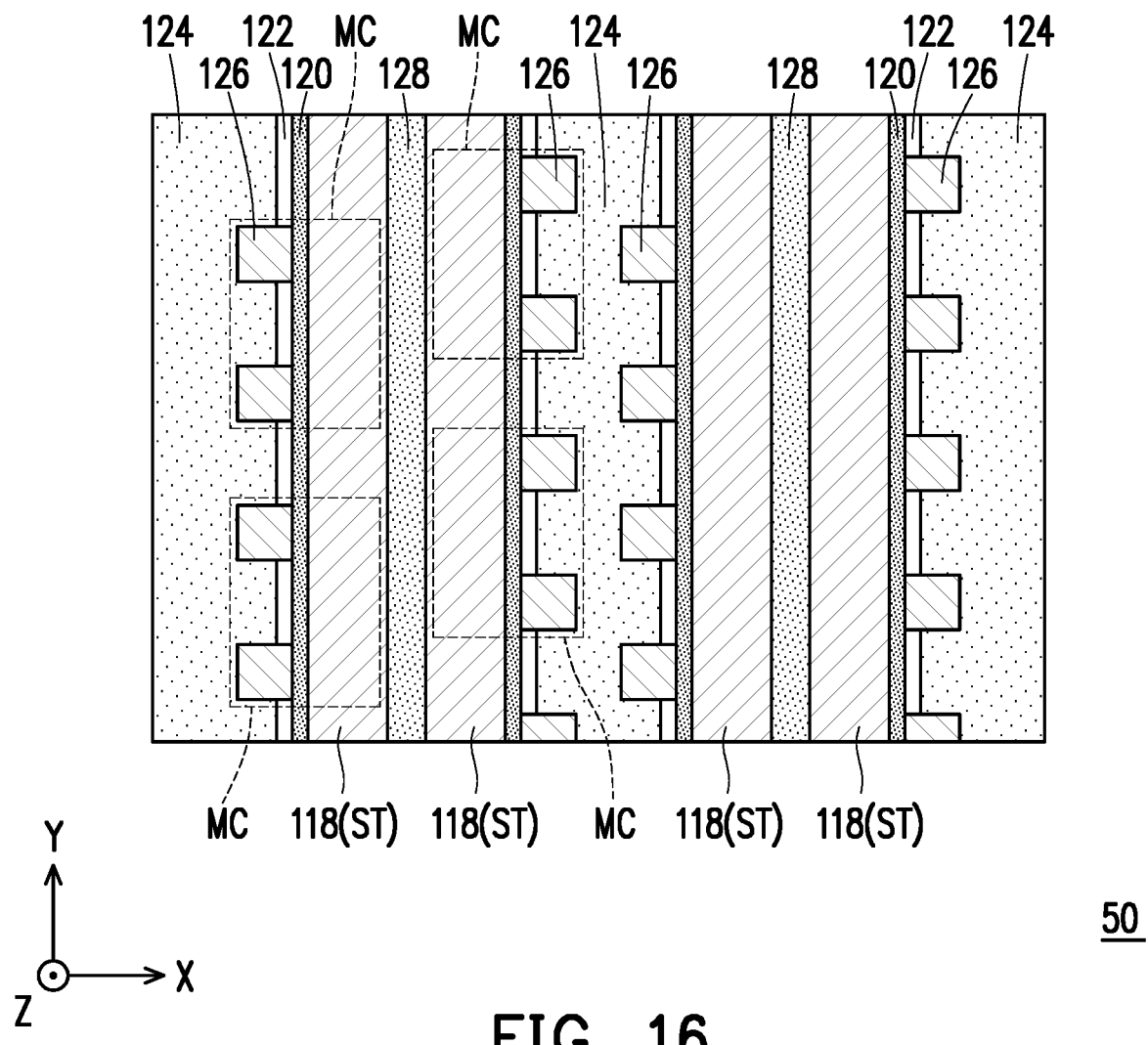
FIG. 16 is a schematic plan view of a three-dimensional memory device in accordance with some alternative embodiments of the present disclosure.

FIG. 16 is a schematic plan view of a three-dimensional memory device in accordance with some alternative embodiments of the present disclosure. The three-dimensional memory device 50 illustrated in FIG. 16 is similar to the three-dimensional memory device 10 illustrated in FIG. 11C. Hence, the same reference numerals are used to refer to the same or liked parts and its detailed description will be omitted herein. The differences between the three-dimensional memory device 50 illustrated in FIG. 16 and the three-dimensional memory device 10 illustrated in FIG. 11C will be described below.

Referring to FIG. 16, in three-dimensional memory device 50, the conductive pillars 126 are formed in a staggered configuration. In detail, the columns of the conductive pillars 126 are alternately offset from others along the same direction (e.g., the direction Y). For instance, even columns of the conductive pillars 126 are offset from odd columns of the conductive pillars 126 along the direction Y. In some embodiments, as shown in FIG. 16, the columns of the conductive pillars 126 are alternately offset from others along the direction Y by substantially identical offset amount. In addition, although not shown, the three-dimensional memory device 50 further includes bit lines and source lines electrically connected to the conductive pillars 126. In embodiments where columns of the conductive pillars 126 are alternately offset from others, the conductive pillars 126 in adjacent stacks of memory cells MC may be connected to different bit lines and different source lines. In some embodiments, the source lines and the bit lines all extend above the stacking structures ST. However, the disclosure is not limited thereto. In some alternative embodiments, the bit lines and the source lines are disposed at opposite sides of the substrate 100. Further, although not shown, the three-dimensional memory device 50 may further include insulators between the laterally adjacent memory cells MC along the direction Y as described with reference to FIG. 14.

In accordance with an embodiment, a three-dimensional memory device includes: a first stacking structure including first stacking layers stacked along a vertical direction, wherein each of the first stacking layers includes a first gate layer, a first ferroelectric layer, and a first channel layer, wherein the first gate layer, the first ferroelectric layer, and the first channel layer respectively extend along a horizontal direction perpendicular to the vertical direction, and wherein the first ferroelectric layer is disposed between the first gate layer and the first channel layer; a second stacking structure laterally spaced apart from the first stacking structure and including second stacking layers stacked along the vertical direction, wherein each of the second stacking layers includes a second gate layer, a second ferroelectric layer, and a second channel layer, wherein the second gate layer, the second ferroelectric layer, and the second channel layer respectively extend along the horizontal direction, the second ferroelectric layer is disposed between the second gate layer and the second channel layer, and the first gate layer and the second gate layer are disposed between the first ferroelectric layer and the second ferroelectric layer; first conductive pillars extending along the vertical direction, laterally separated from one another, and in contact with the first channel layer of each of the first stacking layers; and second conductive pillars extending along the vertical direction, laterally separated from one another, and in contact with the second channel layer of each of the second stacking layers. In some embodiments, the first conductive pillars penetrate through the first channel layer of each of the first stacking layers along the vertical direction, wherein the second conductive pillars penetrate through the second channel layer of each of the second stacking layers along the vertical direction. In some embodiments, the first conductive pillars are in contact with the first ferroelectric layer of each of the first stacking layers, wherein the second conductive pillars are in contact with the second ferroelectric layer of each of the second stacking layers. In some embodiments, the first conductive pillars are laterally separated from one another by the first channel layer of each of the first stacking layers, wherein the second conductive pillars are laterally separated from one another by the second channel layer of each of the second stacking layers. In some embodiments, the first conductive pillars are laterally separated from the first ferroelectric layer of each of the first stacking layers by the first channel layer of each of the first stacking layers, wherein the second conductive pillars are laterally separated from the second ferroelectric layer of each of the second stacking layers by the second channel layer of each of the second stacking layers. In some embodiments, the three-dimensional memory device further includes: first insulators penetrating through the first channel layer of each of the first stacking layers along the vertical direction and laterally separated from one another; and second insulators penetrating through the second channel layer of each of the second stacking layers along the vertical direction and laterally separated from one another. In some embodiments, two of the first conductive pillars are disposed between two adjacent first insulators, wherein two of the second conductive pillars are disposed between two adjacent second insulators. In some embodiments, the three-dimensional memory device further includes a dielectric wall disposed between the first stacking structure and the second stacking structure, wherein the dielectric wall is disposed between the first gate layer of each of the first stacking layers and the second gate layer of each of the second stacking layers.

In accordance with an embodiment, a three-dimensional memory device includes: a first stacking structure and a second stacking structure disposed on a substrate and laterally spaced apart from each other, wherein the first stacking structure includes first insulating layers and first gate layers alternately stacked on the substrate, and wherein the second stacking structure includes second insulating layers and second gate layers alternately stacked on the substrate; a dielectric wall disposed on the substrate and between the first stacking structure and the second stacking structure; first ferroelectric layers disposed between the dielectric wall and the first gate layers, wherein each of the first ferroelectric layers is disposed between two adjacent first insulating layers; first channel layers disposed between the dielectric wall and the first ferroelectric layers, wherein each of the first channel layers is disposed between two adjacent first insulating layers; second ferroelectric layers disposed between the dielectric wall and the second gate layers, wherein each of the second ferroelectric layers is disposed between two adjacent second insulating layers; second channel layers disposed between the dielectric wall and the second ferroelectric layers, wherein each of the second channel layers is disposed between two adjacent second insulating layers; first conductive pillars penetrating through the dielectric wall, laterally separated from one another, and in contact with the first channel layers; and second conductive pillars penetrating through the dielectric wall, laterally separated from one another, and in contact with the second channel layers. In some embodiments, the dielectric wall is in contact with side surfaces of the first insulating layers, side surfaces of the second insulating layers, side surfaces of the first channel layers, and side surfaces of the second channel layers. In some embodiments, side surfaces of the first gate layers are laterally recessed from the side surfaces of the first insulating layers, and the first ferroelectric layers are respectively in contact with the side surfaces of the first gate layers; and side surfaces of the second gate layers are laterally recessed from the side surfaces of the second insulating layers, and the second ferroelectric layers are respectively in contact with the side surfaces of the second gate layers. In some embodiments, each of the first gate layers, each of the second gate layers, each of the first ferroelectric layers, each of the first channel layers, each of the second ferroelectric layers, and each of the second channel layers laterally extend over the substrate along a first direction, and wherein the dielectric wall, each of the first conductive pillars, and each of the second conductive pillars vertically extend along a second direction perpendicular to the first direction. In some embodiments, the first conductive pillars penetrate through the dielectric wall and the first channel layers along the second direction, wherein the second conductive pillars penetrate through the dielectric wall and the second channel layers along the second direction. In some embodiments, the first conductive pillars penetrate through the dielectric wall along the second direction without penetrating through the first channel layers, wherein the second conductive pillars penetrate through the dielectric wall along the second direction without penetrating through the second channel layers. In some embodiments, the three-dimensional memory device further includes insulators disposed on the substrate, penetrating through the dielectric wall, the first channel layers, and the second channel layers along the second direction, and laterally extending between the first stacking structure and the second stacking structure along a third direction perpendicular to the first direction and the second direction. In some embodiments, two of the first conductive pillars and two of the second conductive pillars are disposed between two adjacent insulators along the first direction.

In accordance with an embodiment, a method includes: forming a multilayer stack on a substrate, wherein the multilayer stack includes insulating layers and sacrificial layers alternately stacked on the substrate; forming a trench vertically penetrating through the multilayer stack; removing portions of the sacrificial layers exposed by the trench to form recesses, wherein each of the recesses is formed between two adjacent insulating layers; forming ferroelectric layers in the recesses to cover side surfaces of remaining portions of the sacrificial layers exposed by the recesses; forming channel layers in the recesses to be in contact with the ferroelectric layers; filling up the trench with a dielectric material to form a dielectric wall; forming conductive pillars vertically penetrating through the dielectric wall; and replacing remaining portions of the sacrificial layers by gate layers. In some embodiments, the insulating layers and the sacrificial layers include materials with different etching selectivities. In some embodiments, the method further includes forming insulators vertically penetrating through the dielectric wall and the channel layers. In some embodiments, the replacing of the remaining portions of the sacrificial layers by the gate layers includes: forming trenches vertically penetrating through the multilayer stack; removing the remaining portions of the sacrificial layers via the trenches to form gaps, wherein each of the gaps is formed between two adjacent insulating layers; and forming the gate layers in the gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a multilayer stack on a substrate, wherein the multilayer stack comprises insulating layers and sacrificial layers alternately stacked on the substrate;
    forming a first trench vertically penetrating through the multilayer stack;
    removing portions of the sacrificial layers exposed by the first trench to form recesses, wherein each of the recesses is formed between two adjacent insulating layers of the insulating layers;
    forming ferroelectric layers in the recesses to cover side surfaces of remaining portions of the sacrificial layers exposed by the recesses;
    forming channel layers in the recesses to be in contact with the ferroelectric layers;
    filling up the first trench with a dielectric material to form a first dielectric wall;
    forming conductive pillars vertically penetrating through the first dielectric wall; and
    replacing the remaining portions of the sacrificial layers by gate layers.

2. The method according to claim 1, wherein the insulating layers and the sacrificial layers comprise materials with different etching selectivities.

3. The method according to claim 1, wherein the replacing of the remaining portions of the sacrificial layers by the gate layers comprises:
    forming second trenches vertically penetrating through the multilayer stack;
    removing the remaining portions of the sacrificial layers via the second trenches to form gaps, wherein each of the gaps is formed between the two adjacent insulating layers of the insulating layers; and
    forming the gate layers in the gaps.

4. The method according to claim 3, wherein the gate layers are localized to the gaps, and wherein the replacing further comprises filling up the second trenches with an additional dielectric material to form second dielectric walls.

5. The method according to claim 1, wherein the ferroelectric layers and the channel layers are confined to the recesses.

6. The method according to claim 1, wherein the forming of the conductive pillars comprises:
    forming through holes extending through the first dielectric wall and the channel layers; and
    filling the through holes with conductive material.

7. The method according to claim 1, wherein the insulating layers comprise silicon oxide, and wherein the sacrificial layers comprise silicon nitride.

8. The method according to claim 1, further comprising forming insulators vertically penetrating through the first dielectric wall and the channel layers.

9. A method, comprising:
    forming a stack on a substrate and comprising a first dielectric layer, a second dielectric layer, and a sacrificial layer between the first dielectric layer and the second dielectric layer;
    performing a first etch into the stack to form a first trench, wherein first individual sidewalls of the first dielectric layer, the second dielectric layer, and the sacrificial layer form a first common sidewall in the first trench;
    forming a semiconductor layer and a ferroelectric layer laterally recessed into the first common sidewall at the sacrificial layer;
    forming a first source electrode and a first drain electrode at the first common sidewall;
    performing a second etch into the stack to form a second trench, wherein the second trench exposes the sacrificial layer;
    performing a third etch into the sacrificial layer through the second trench to remove the sacrificial layer and to form a first gap; and
    forming a first gate electrode in the first gap.

10. The method according to claim 9, wherein the first individual sidewalls comprise a sidewall of the first dielectric layer, a sidewall of the second dielectric layer, and a sidewall of the sacrificial layer, and wherein the forming of the semiconductor layer and the ferroelectric layer comprises:
    performing a fourth etch into the sacrificial layer through the first trench to recess the sidewall of the sacrificial layer relative to the sidewall of the first dielectric layer and the sidewall of the second dielectric layer.

11. The method according to claim 10, wherein the ferroelectric layer is formed directly contacting the sidewall of the sacrificial layer, and wherein the semiconductor layer is formed directly contacting the ferroelectric layer.

12. The method according to claim 9, wherein the first trench has a line-shaped top geometry with a greatest dimension extending laterally in a first direction, and wherein the semiconductor layer and the ferroelectric layer are formed recessed into the first common sidewall laterally in a second direction transverse to the first direction.

13. The method according to claim 9, wherein second individual sidewalls of the first dielectric layer, the second dielectric layer, and the sacrificial layer form a second common sidewall in the first trench, wherein the second common sidewall faces the first common sidewall on an opposite side of the first trench as the first common sidewall, and wherein the forming of the first source electrode and the first drain electrode comprises:

forming a second source electrode and a second drain electrode at the second common sidewall.

14. The method according to claim 13, wherein the method further comprises forming a dielectric wall filling the first trench, and wherein the second source electrode and the second drain electrode are formed separated from the first source electrode and the first drain electrode by the dielectric wall.

15. The method according to claim 9, wherein the third etch forms a second gap on an opposite side of the second trench as the first gap, and wherein the method further comprises:
forming a second gate electrode in the second gap; and
forming a dielectric wall filling the second trench and separating the first gate electrode and the second gate electrode.

16. A method, comprising:
forming a stack comprising a first dielectric layer, a sacrificial layer overlying the first dielectric layer, and a second dielectric layer overlying the sacrificial layer;
performing a first etch into the stack to form a first trench;
performing a second etch into the sacrificial layer to increase a first width of the first trench at the sacrificial layer relative to a second width of the first trench at the first dielectric layer and the second dielectric layer;
forming a semiconductor layer and a ferroelectric layer between the first dielectric layer and the second dielectric layer, at the increased first width of the first trench;
performing a third etch into the stack to form a second trench on an opposite side of the semiconductor layer as the first trench; and
replacing the sacrificial layer with a gate electrode through the second trench.

17. The method according to claim 16, wherein the first etch forms another first trench, and wherein the stack comprises a columnar structure sandwiched between the first trench and the other first trench after the first etch.

18. The method according to claim 16, wherein the semiconductor layer and the ferroelectric layer underlie the second dielectric layer and overlie the first dielectric layer.

19. The method according to claim 16, wherein the semiconductor layer separates the ferroelectric layer from the first trench.

20. The method according to claim 16, further comprising:
forming a first dielectric wall filling the first trench; and
forming a second dielectric wall filling the second trench.

* * * * *